United States Patent
Huang et al.

(10) Patent No.: US 8,335,080 B2
(45) Date of Patent: Dec. 18, 2012

(54) SLIDING RAIL HAVING ANTI-TILTING MECHANISM

(75) Inventors: Tsung-Chi Huang, Taipei Hsien (TW); Shiuan-Jang Chen, Taipei Hsien (TW)

(73) Assignee: Infortrend Technology, Inc., Taipei Hsien (TW)

( * ) Notice: Subject to any disclaimer, the term of this patent is extended or adjusted under 35 U.S.C. 154(b) by 337 days.

(21) Appl. No.: 12/762,614

(22) Filed: Apr. 19, 2010

(65) Prior Publication Data

US 2010/0265651 A1 Oct. 21, 2010

Related U.S. Application Data

(60) Provisional application No. 61/170,672, filed on Apr. 20, 2009.

(51) Int. Cl.
G06F 1/16 (2006.01)
H05K 5/00 (2006.01)
H05K 7/00 (2006.01)
A47B 95/00 (2006.01)

(52) U.S. Cl. ............ 361/679.58; 361/727; 312/333

(58) Field of Classification Search .......... 361/679.02, 361/679.58, 724–727; 312/223.1, 294, 330.1, 312/333, 334; 248/618, 633, 634, 636, 638, 248/694
See application file for complete search history.

(56) References Cited

U.S. PATENT DOCUMENTS

| 4,891,475 | A * | 1/1990 | Wiersing et al. | 200/5 R |
| 5,571,256 | A * | 11/1996 | Good et al. | 211/26 |
| 5,575,529 | A * | 11/1996 | Dowdy et al. | 312/223.2 |
| 7,188,916 | B2 * | 3/2007 | Silvestro et al. | 312/334.4 |
| 7,701,704 | B2 * | 4/2010 | Huang et al. | 361/679.36 |
| 2001/0037985 | A1 * | 11/2001 | Varghese et al. | 211/26 |
| 2003/0052580 | A1 * | 3/2003 | Dobler et al. | 312/334.44 |
| 2003/0090186 | A1 * | 5/2003 | Weng | 312/333 |
| 2004/0080247 | A1 * | 4/2004 | Dobler et al. | 312/348.1 |
| 2005/0206284 | A1 * | 9/2005 | Dubon et al. | 312/333 |

* cited by examiner

Primary Examiner — Adrian S Wilson
(74) Attorney, Agent, or Firm — Rosenberg, Klein & Lee

(57) ABSTRACT

A sliding rail having anti-tilting mechanism is disclosed. The sliding rail includes a slidable connecting piece that is located at an enclosure and that has a fourth retaining portion, a slider whose outer side has a second slidable connecting portion and whose inner side has a resilient piece with a second retaining portion and a third retaining portion that is used to retain or release the fourth retaining portion, and a support with a first slidable connecting portion and a first retaining portion, wherein the second slidable connecting portion is connected with the first slidable connecting portion and moves in the forward and backward direction. When the slider and the support are located at the first relative location, the resilient piece retains the fourth retaining portion. When the slider and the support are located at the second relative location, the slidable connecting piece is released from the slider.

20 Claims, 34 Drawing Sheets

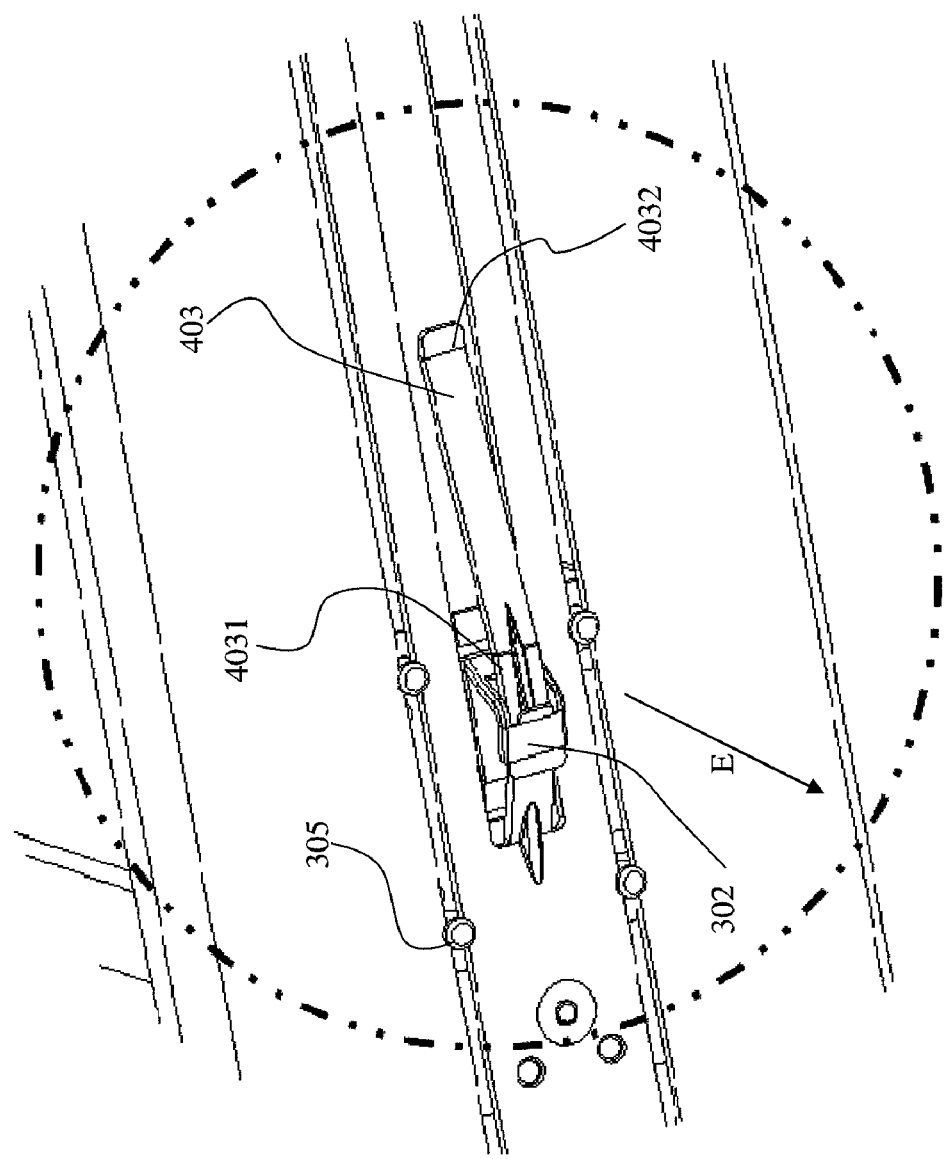

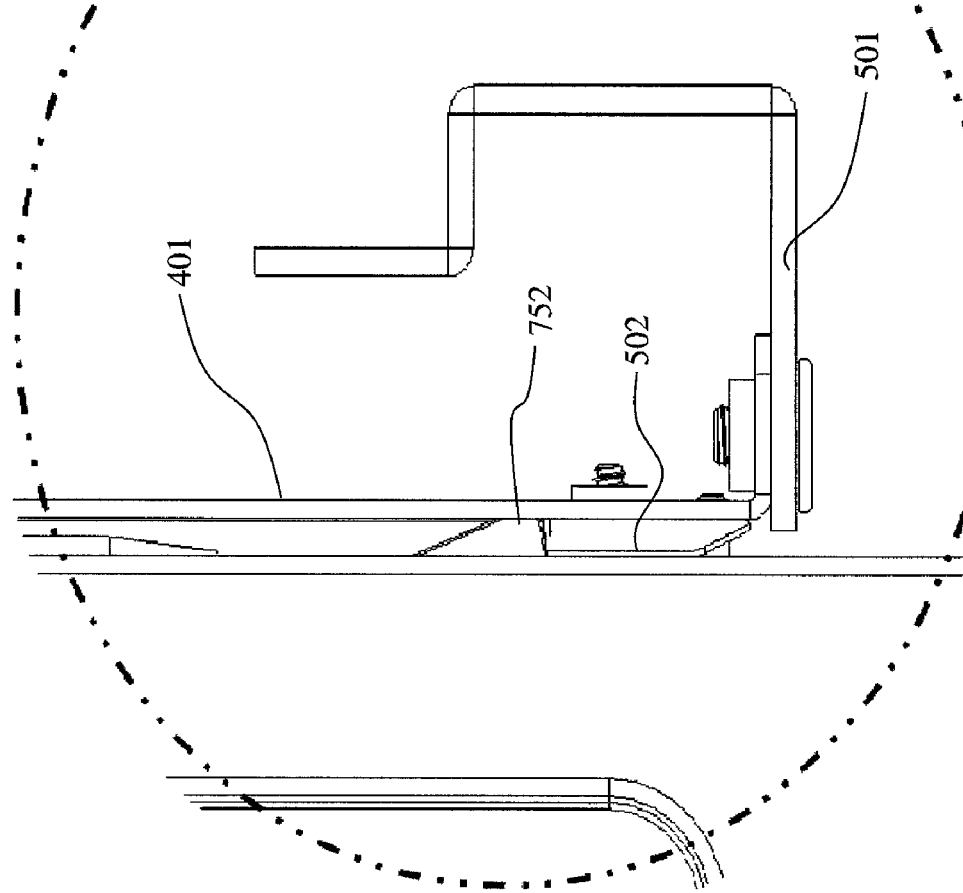

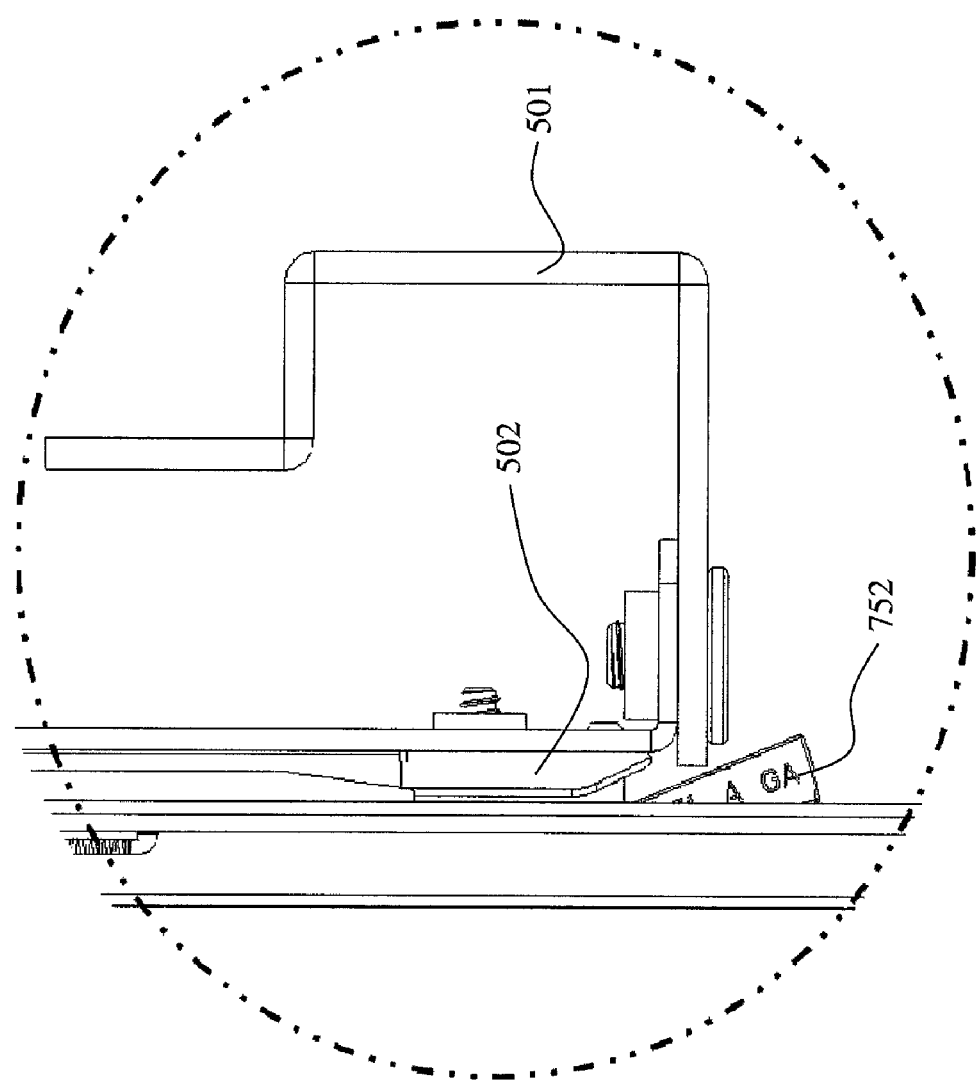

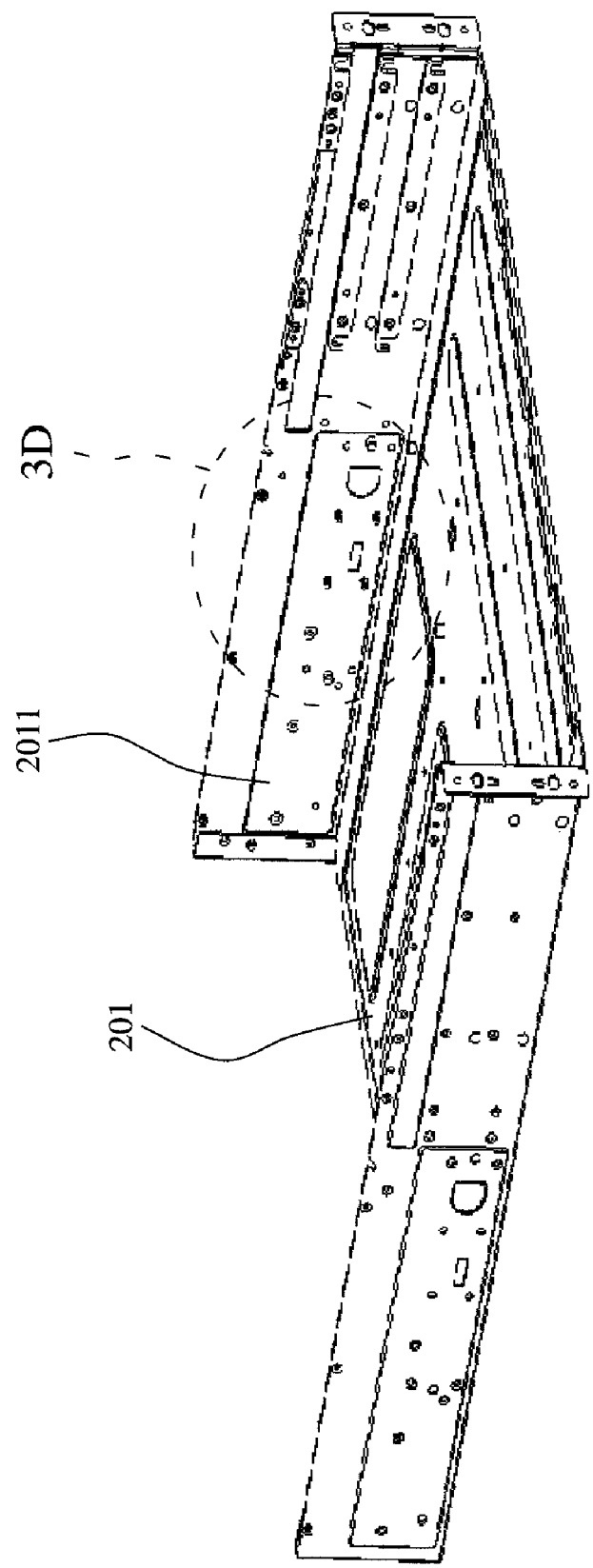

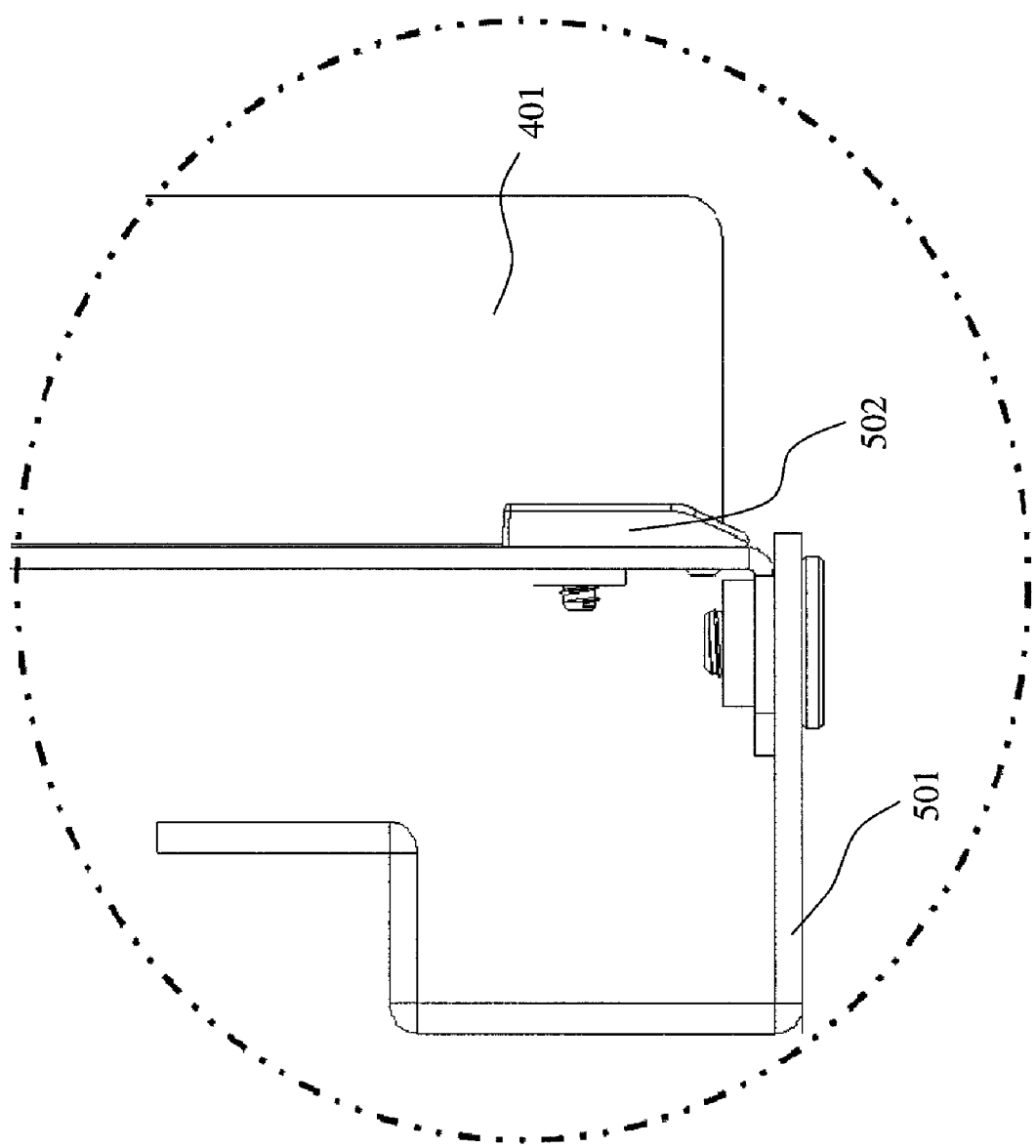

SLIDING RAIL HAVING ANTI-TILTING MECHANISM

REFERENCE TO RELATED APPLICATION

This patent application is based on Provisional Patent Application Ser. No. 61/170,672, filed 20 Apr. 2009, currently pending.

BACKGROUND OF THE INVENTION

1. Field of the Invention

The present invention relates to a sliding rail having an anti-tilting mechanism for an enclosure. In particular, the present invention relates to a sliding rail having the anti-tilting mechanism that supports electronic devices, such as, controllers and redundant array of independent disks (RAID) in the enclosure and prevents the enclosure from turning over and dropping.

2. Description of Related Art

Generally speaking, electronic equipments, such as redundant array of independent disks or servers, includes a plurality of electronic devices that are installed in an enclosure placed on a server rack. At the same time, there are more and more electronic devices installed in the electronic equipment, such as controllers, disk drivers, fans, power supplies, and server motherboards. All are installed in the same enclosure so that the weight of the enclosure where the electronic devices are installed is getting heavier and heavier. When the enclosure is drawn out or moved, the enclosure may be turned over because of the center of gravity of the enclosure. When the user does not hold the enclosure well, the enclosure will drop to the ground so that the electronic devices in the enclosure are damaged, and the user may get hurt.

Reference is made to FIG. 8 which shows the problem in the prior art. FIG. 8 shows the schematic diagram of the electronic equipment being installed of the prior art. An enclosure 601 and a server rack (not labeled) are shown from side view. The server rack includes a rail 603, four vertical posts 602 (the figure merely shows two vertical posts 602 on one side), and other parts (not shown). The enclosure 601 is installed with electronic devices (not shown), such as servers, redundant array of independent disks, fans, and power supplies. The posts 602 stand on the ground in a vertical manner. A plurality of rails 603 are fastened between the posts 602 in the horizontal way for carrying the enclosure 601. When the user draws out or moves the enclosure 601 along the direction of arrow A, and the center of gravity of the enclosure 601 surpasses the end of the rail 603, the user needs to exert a force onto the enclosure 601 to prevent the enclosure 601 from dropping to the ground. On the other hand, if the user keeps drawing out or moving the enclosure 601 along the direction of arrow A and makes the center of gravity of the enclosure 601 surpass the end of the rail 603, and the user does not exert an appropriate force onto the enclosure 601 in time, the enclosure 601 will be turned over along the direction of arrow B and drops to the ground. Therefore, the electronic devices installed in the enclosure, such as servers, RAID, fans and power supplies, will be damaged and the user may get hurt.

SUMMARY OF THE INVENTION

It is one aspect of the present invention to provide a sliding rail having an anti-tilting mechanism that prevents the enclosure from being turned over and dropping to the ground.

It is another aspect of the present invention to provide a sliding rail having the anti-tilting mechanism that is effort-saving for user. The user can easily draw or move the enclosure, the electronic devices in the enclosure will not be damaged, and the user will not get hurt.

To achieve the above aspects, the present invention provides the sliding rail having the anti-tilting mechanism which includes a slidable connecting piece that is located on one side of an enclosure and that has a fourth retaining portion, a slider that has a second slidable connecting portion on an outer side of the slider and that has a resilient piece on an inner side of the slider, and a support that has a first slidable connecting portion and has a first retaining portion, wherein the resilient piece has a third retaining portion in order to retain or release the fourth retaining portion of the slidable connecting piece and has a second retaining portion, the second slidable connecting portion of the slider is slidably connected with the first slidable connecting portion and makes a relative movement back and forth. When the slider and the support are located at a first relative location, the resilient piece of the slider retains the fourth retaining portion of the slidable connecting piece. And, when the slider and the support are at a second relative location, the first retaining portion of the support passes through the third retaining portion of the resilient piece, and the first retaining portion compresses the second retaining portion of the resilient piece to move out to let the slidable connecting piece of the enclosure be released from the slider.

In another embodiment, the slider of the sliding rail having the anti-tilting mechanism further includes a first limitation portion to retain the slidable connecting piece of the enclosure in the slider.

In another embodiment, the third retaining portion of the resilient piece of the sliding rail having the anti-tilting mechanism gets contact with the fourth retaining portion of the slidable connecting piece in order to retain the fourth retaining portion hole of the slidable connecting piece, so that the slidable connecting piece of the enclosure is retained in the slide.

In another embodiment, the enclosure receives at least one electronic device, and the at least one electronic device includes at least one of a server, a redundant array of independent disks, a fan, and a power supply.

In another embodiment, the sliding rail having anti-tilting mechanism further includes a block that blocks the slider so that when at the second relative location, the slider does not move any more.

In another embodiment, the second slidable connecting portion is a mushroom-shaped guide pin.

In another embodiment, the second slidable connecting portion is a mushroom-shaped guide pin, wherein the second slidable connecting portion is fastened on the outer side of the slider by a press way.

In another embodiment, the first slidable connecting portion is a trench.

In another embodiment, the resilient piece is a 7-shaped resilient piece.

In another embodiment, the resilient piece is fastened on the inner side of the slider.

In another embodiment, the first retaining portion is a V-shaped guide pin.

In another embodiment, a compression portion of the first retaining portion compresses the second retaining portion of the resilient piece and makes the second retaining portion move out, so that the third retaining portion of the resilient piece does not get contact with the fourth retaining portion of the slidable connecting piece in order to release the slidable connecting piece of the enclosure from the slider.

In another embodiment, when the slider and the support are located at the first relative location, the resilient piece of the slider retains the fourth retaining portion of the slidable connecting piece to slide along the trench.

In another embodiment, the sliding rail having anti-tilting mechanism further includes a locking mechanism. The locking mechanism includes a base, a stopping rod that is fastened on the base in a pivoting way and that has an end, a slidable plate that is located on the base and makes a relative movement to the base, and an elastic piece for hooking the slidable plate to make the end of the stopping rod extend out, wherein the end extends out or draws back inwards in order to determine whether to get contact with a stopper or not, and the end of stopping rod is controlled to extend out or draw back inwards by moving the slidable plate back and forth.

In another embodiment, the sliding rail having anti-tilting mechanism further includes a base, a stopping rod that is fastened on the base in a pivoting way, a slidable plate that is located on the base and that makes a movement between a third location and a fourth location relative to the base, and an elastic piece for keeping the stopping rod at the first angle location in a normal status, wherein when the slidable plate is at the third location, the stopping rod is at a first angle location so that the enclosure is not drawn from the support, and when the slidable plate is at the fourth location, the stopping rod is at a second angle location so that the enclosure is drawn from the support.

To achieve the above aspects, the present invention further provides a locking mechanism which includes a base, a stopping rod that is fastened on the base in a pivoting way, a slidable plate that is located on the base and makes a movement between a third location and a fourth location relative to the base, and an elastic piece for keeping the stopping rod at the first angle location in a normal status, wherein when the slidable plate is at the third location, the stopping rod is at a first angle location so that the enclosure is not drawn from the support, and when the slidable plate is at the fourth location, the stopping rod is at a second angle location so that the enclosure is drawn from the support.

To achieve the above aspects, the present invention further provides a sliding rail having an anti-tilting mechanism which includes a slidable connecting piece that is located on one side of an enclosure and that has a fourth retaining portion, a slider that has a second slidable connecting portion and a third retaining portion, and a support that has a first slidable connecting portion and a first retaining portion, wherein the third retaining portion is used to retain or release the fourth retaining portion of the slidable connecting piece, and the second slidable connecting portion of the slider is connected with the first slidable connecting portion and makes a relative movement back and forth. Here, when the slider and the support are at a first relative location, the third retaining portion of the slider retains the fourth retaining portion of the slidable connecting piece, and when the slider and the support are at a second relative location, the first retaining portion of the support makes the third retaining portion move so that the slidable connecting piece of the enclosure is released from the slider.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

FIGS. 2A to 2K are enlarged partial views of FIGS. 1A to 1D;

FIG. 3A to 3C are perspective views of the enclosure according to the embodiment of the present invention;

FIG. 6C is an enlarged top partial view of the stopping block according to the embodiment of the present invention;

DETAILED DESCRIPTION OF THE PREFERRED EMBODIMENTS

Figure 1A:
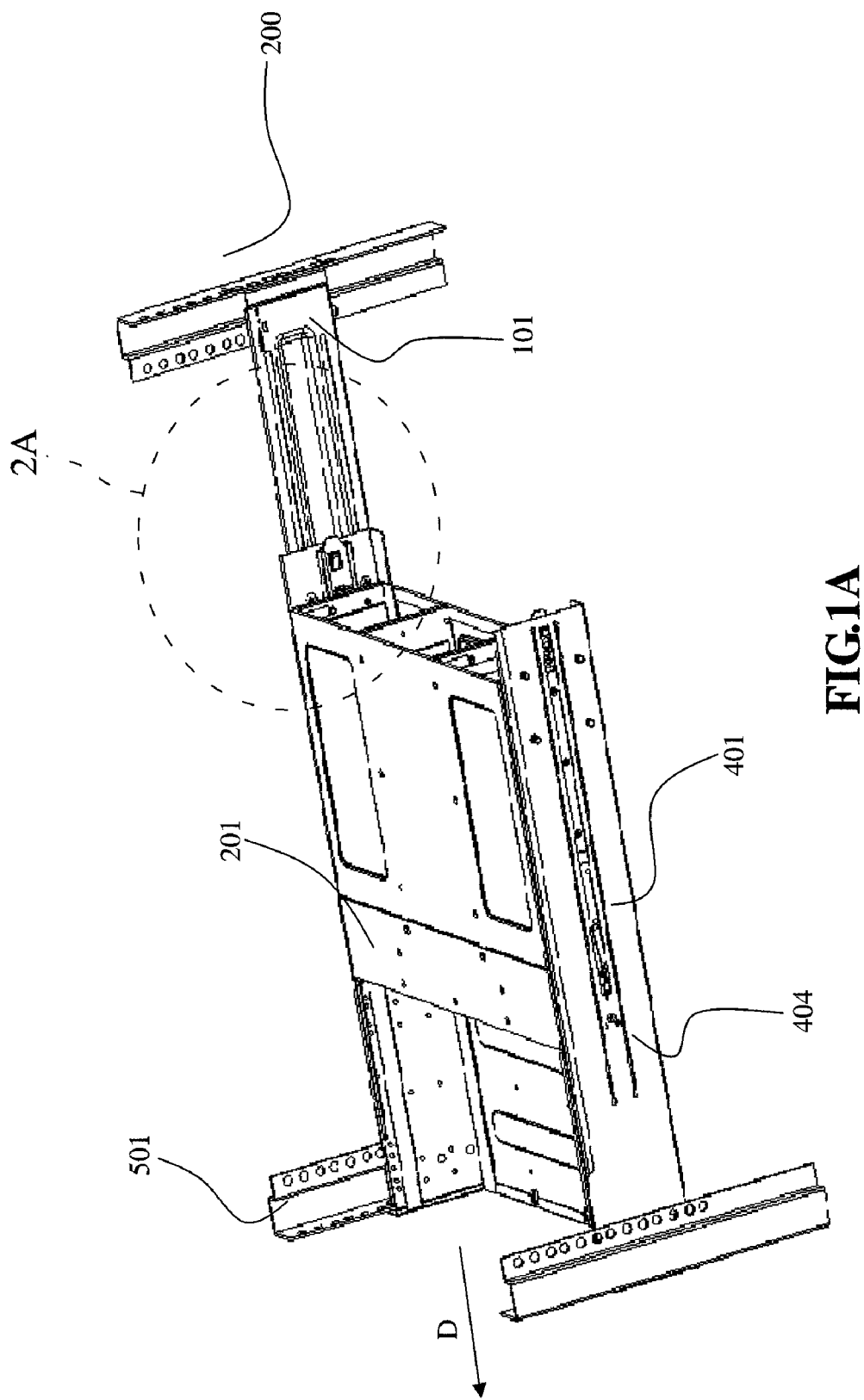
FIGS. 1A to 1D are perspective views of the various movements according to the embodiment of the present invention.

In accordance with one embodiment of the present invention, the sliding rail having an anti-tilting mechanism (as shown in FIGS. 1A to 7F) includes: a slidable connecting piece 202 which is located on one side of an enclosure 201, and which is provided with a first hole 205; a slider 301, an outer side of which is provided with a second slidable connecting portion 305, and an inner side of which is provided with a resilient piece 302 in order to retain or release the first hole 205 of the slidable connecting piece 202, and the resilient piece 302 is provided with a second retaining portion 303; and a support 401 which is provided with a first retaining portion 403 and which is provided with a first slidable connecting portion 404 so that the second slidable connecting portion 305 of the slider 301 gets contact with the first slidable connecting portion 404 to have a relative movement in the forward and backward direction, wherein when the slider 301 and the supporter 401 are at the first relative location, the resilient piece 302 of the slider 301 retains the first hole 205 of the slidable connecting piece 202. Further, when the enclosure 201 is drawn out, and the slider 301 and the support 401 are at the second relative location, the first retaining portion 403 of the support 401 passes through the second retaining portion 303 of the resilient piece 302, and further, the first retaining portion 403 compresses the second retaining portion 303 of the resilient piece 302 outward so as to make the slidable connecting piece 202 of the enclosure 201 released from the slider 301.

In another embodiment of the present invention, the sliding rail having anti-tilting mechanism further includes a locking mechanism 700. The locking mechanism 700 includes a base 710, a slidable plate 720, a spring 730, and a stopping rod 750 having an end 752. The stopping rod 750 is fastened on the base 710 in a pivoting way, and the end 752 extends out or draws back inwards in order to determine whether to get contact with a stopper 502 or not. The slidable plate 720 moves back and forth on the side surface of the base 710 to control the end 752 of the stopping rod 750 to extend out or to draw back inwards. The spring 730 is used for hooking the slidable plate 720 to keep the end 752 of the stopping rod 750 extending out.

Figure 3A:
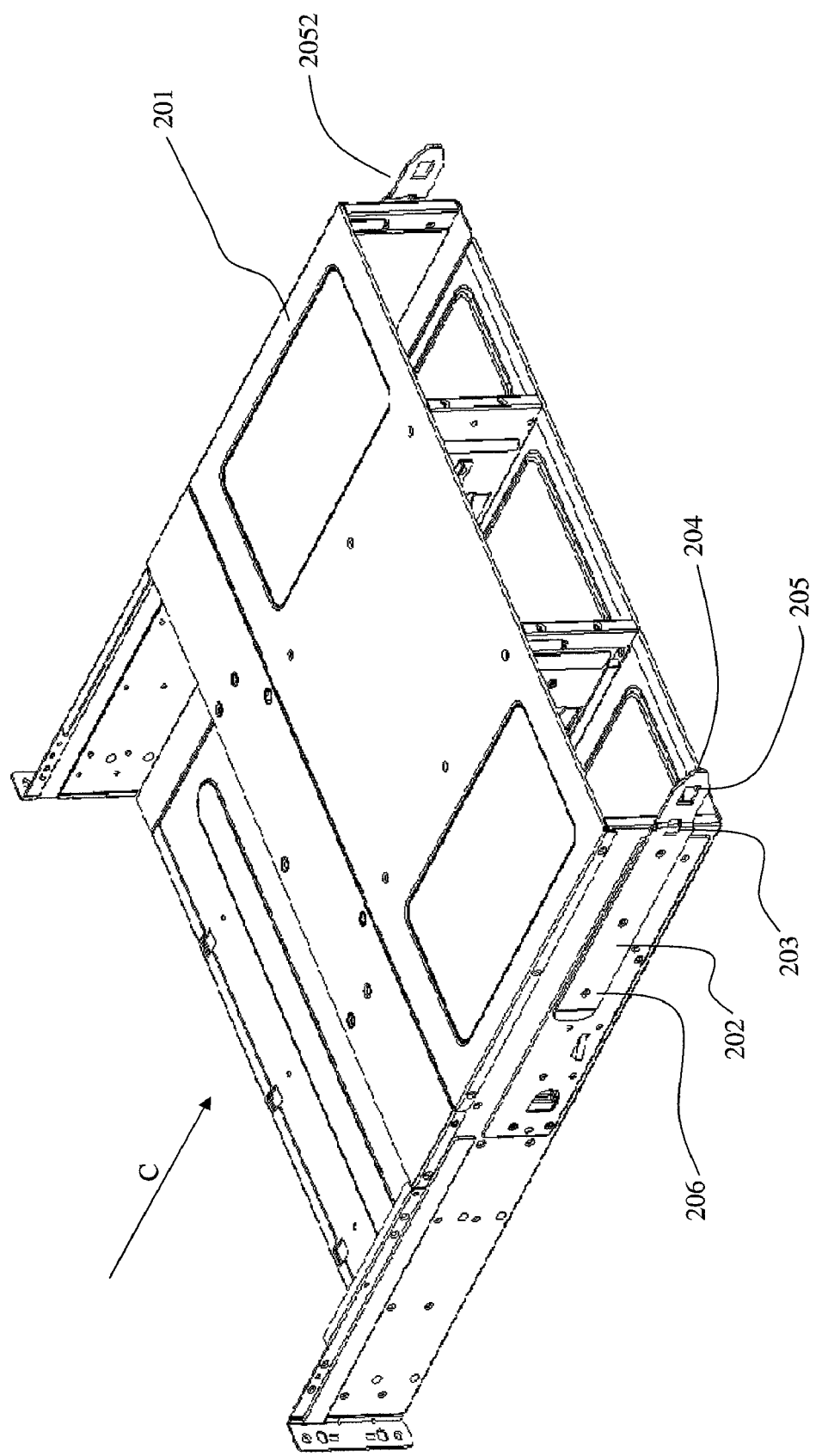
Figure 3B:
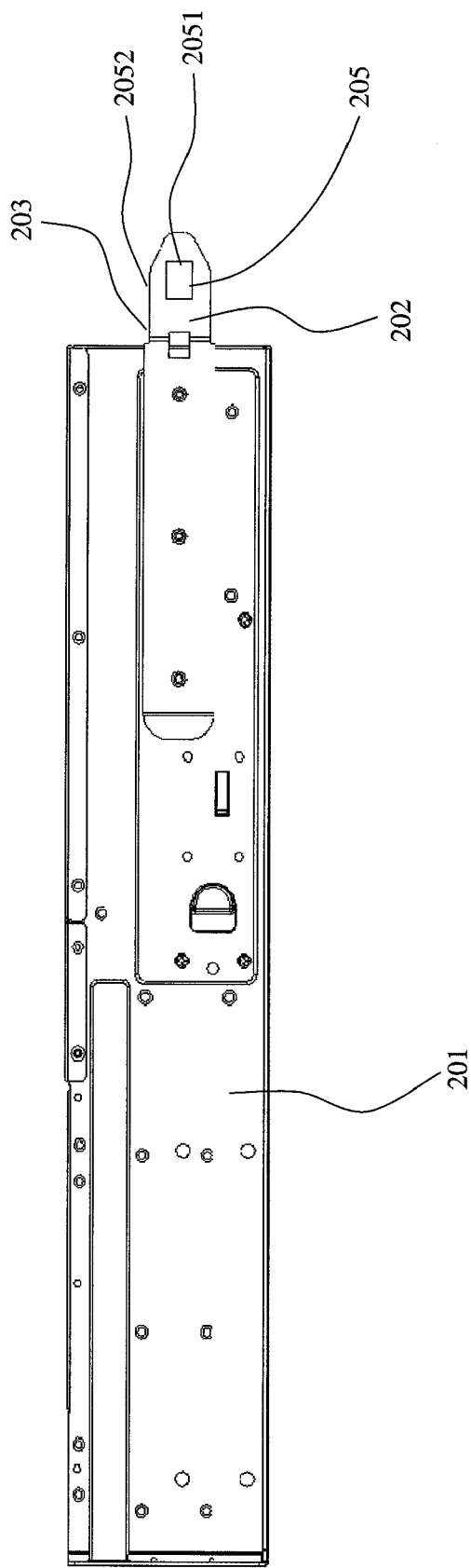
Figure 3D:
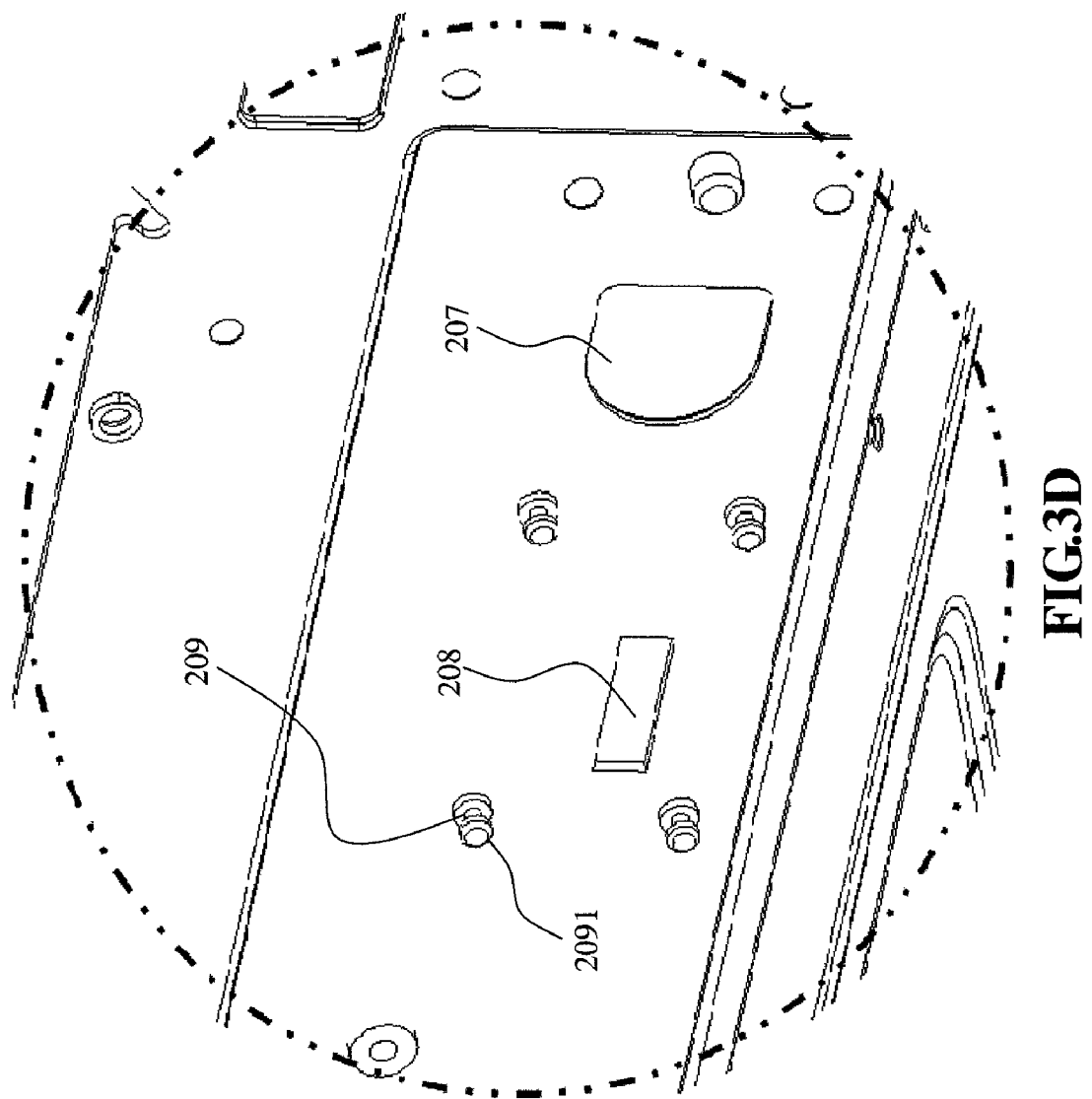
FIG. 3D is an enlarged partial view of FIG. 3C.

Reference is made to FIGS. 3A to 3D, which show the perspective view, side view and enlarged partial view of the enclosure 201 of the present invention. As shown in FIGS. 3A and 3B, the enclosure 201 can receives at least one electronic device, such as controllers, disk drivers, fans, and power supplies (not shown), in the direction of arrow C, and has a slidable connecting piece 202 (such as an ear portion 202) on the side surface of the enclosure 201, wherein the ear portion 202 has a bending portion 203, an end 204, and a first hole 205 and is wedged with a resilient piece 302 (such as, 7-shaped resilient piece 302) of a slider 301. Moreover, the ear portion 202 can be integrated with the enclosure 201 into one piece, or can be an independent element that is fastened on the side surface of the enclosure 201 by a fastening part 206 (such as a rivet 206, a screw 206, or a nail 206) or a welding way (not shown). The fastening part 206 and the welding way are taken for examples, and not limited herein. Furthermore, when the ear portion 202 slides in the slider 301, the bending portion 203 of the ear portion 202 is used for preventing the end 204 from interfering with the rivet head 3041 in FIG. 4B. In another embodiment of the present invention, when the end 204 of the ear portion 202 does not interfere with the slider 301, the bending portion 203 is option and is not necessary. In another embodiment of the present invention, when the ear portion 202 is integrated with the enclosure 201 into one piece, provision of the ear portion 202 can help the bending portion 203 to connect the slider 301. Reference is made to FIGS. 3C and 3D, in which on the inner side of the side wall 2011 of the enclosure 201, there is a third slidable connecting portion 209 (such as a mushroom-shaped guide pin 209), and the mushroom-shaped guide pin 209 has a flange 2091. Furthermore, there are two holes 208, 207 on the side wall 2011 of the enclosure 201 for operating with the locking mechanism 700 together.

Figure 4A:
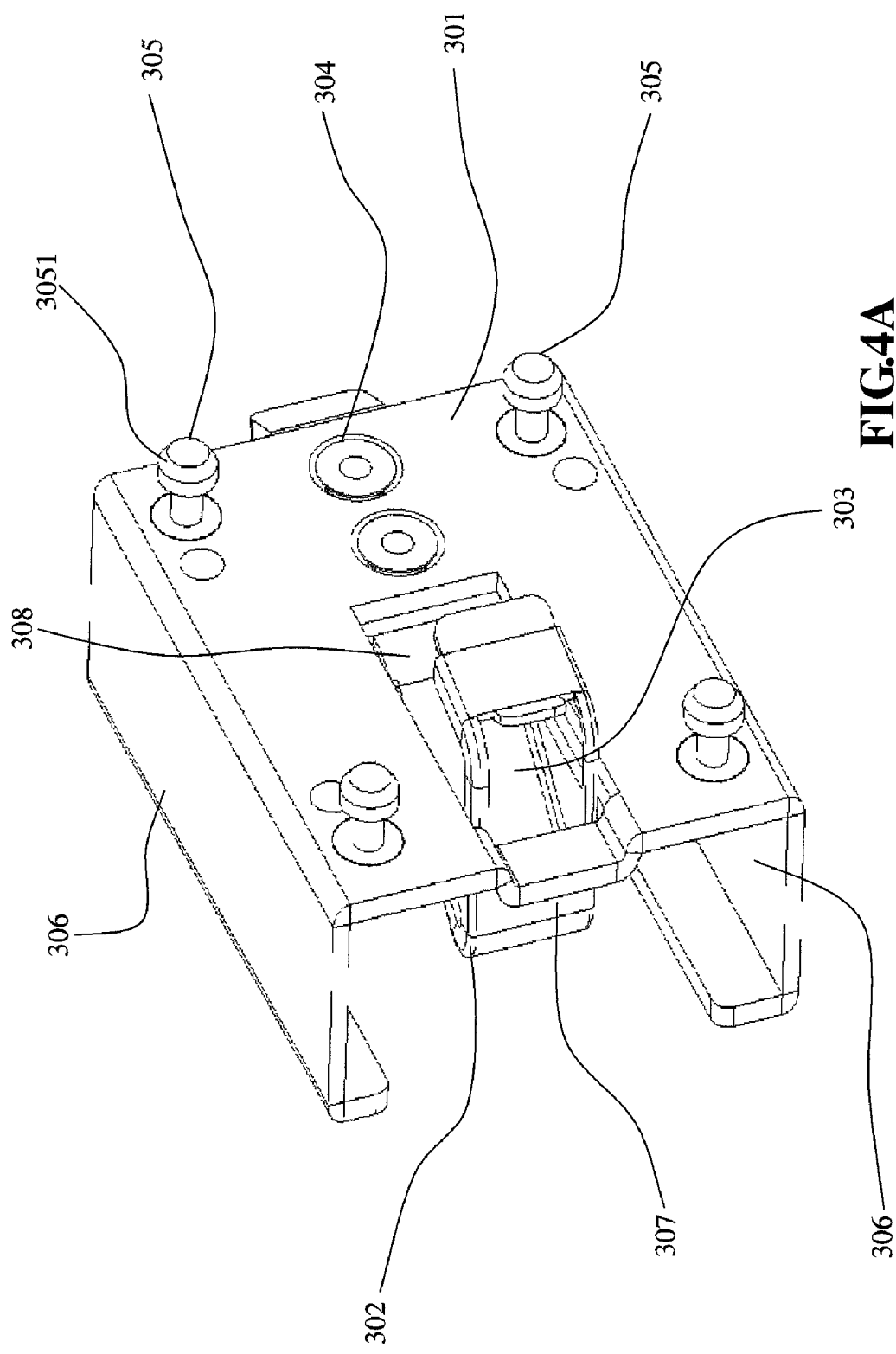
FIGS. 4A to 4B are perspective views of the slider according to the embodiment of the present invention.
Figure 4B:
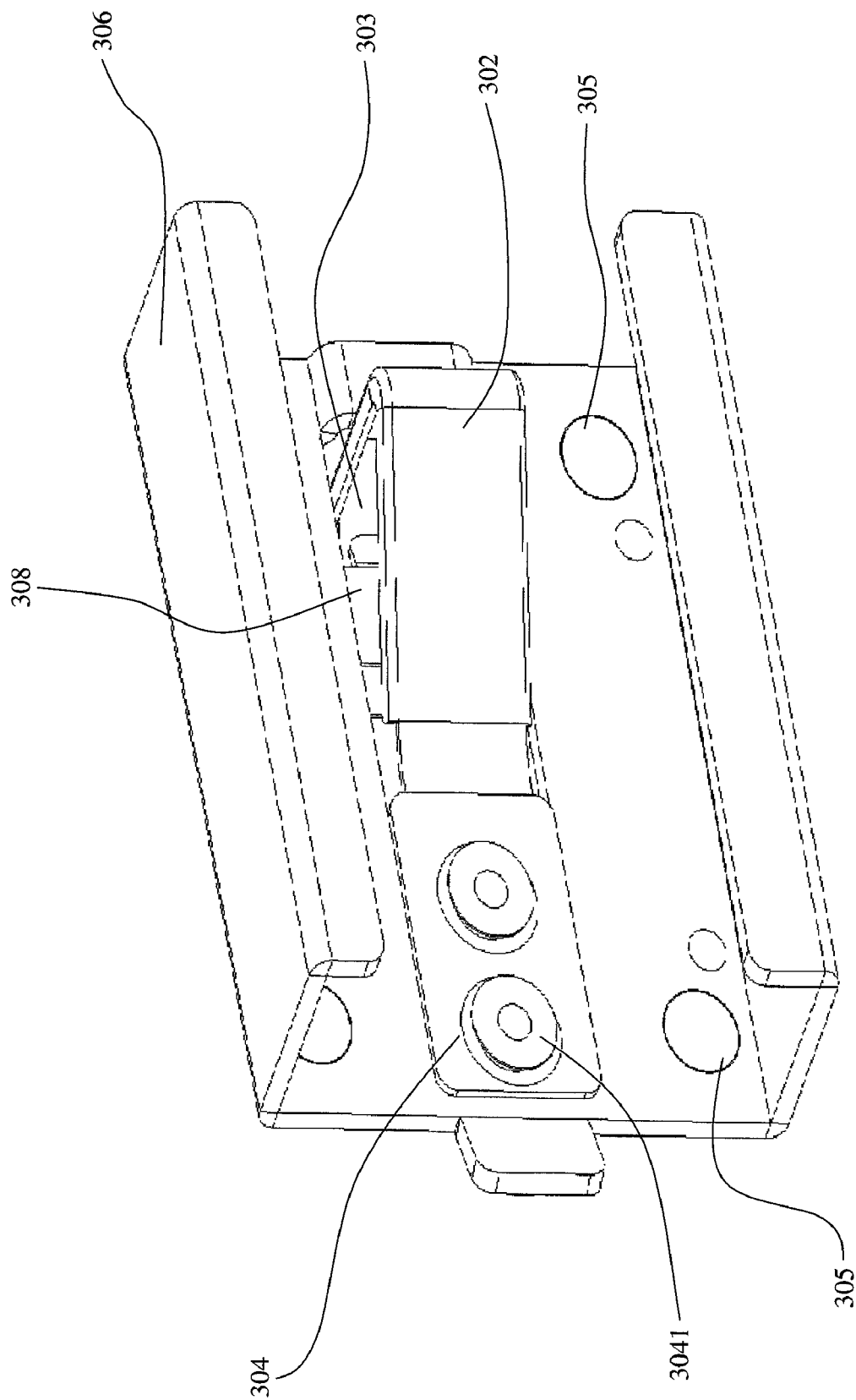

Reference is made to FIGS. 4A to 4B, which are the perspective views of the slider 301 of the present invention. The slider 301 has the 7-shaped resilient piece 302 that is located on the inner side of the slider 301, and the slider 301 has a second slidable connecting portion 305 that is located on the outer side wall of the slider 301 (such as mushroom-shaped guide pins 305), wherein the 7-shaped resilient piece 302 extends toward the rear side of the inner side of the slider 301, then is bent out and passes through a hole 308 of the slider 301 so that the 7-shaped resilient piece 302 extends and reaches outside of the slider 301. Furthermore, the 7-shaped resilient piece 302 is fastened on the inner side of the slider 301 by a fastening part 304 (such as a rivet 304, a screw, or a nail) or a welding way. The rivet 304 and the welding way are taken for examples, and not limited herein. In addition, the end of the 7-shaped resilient piece 302 has a second retaining portion 303 (such as a hole 303) and a third retaining portion 307 (such as a top end 307). Moving the top end 307 inward or outward in horizontal direction can get contact with or separate from a fourth retaining portion 2051 (such as an inner edge 2051) of the ear portion 202. Furthermore, by contacting a first limitation portion 306 (such as a side wall 306) of the slider 301 with the second limitation portion 2052 (such as an up edge 2052) of the ear portion 202, the ear portion 202 is restricted in the interior of the slider 301.

Figure 5A:
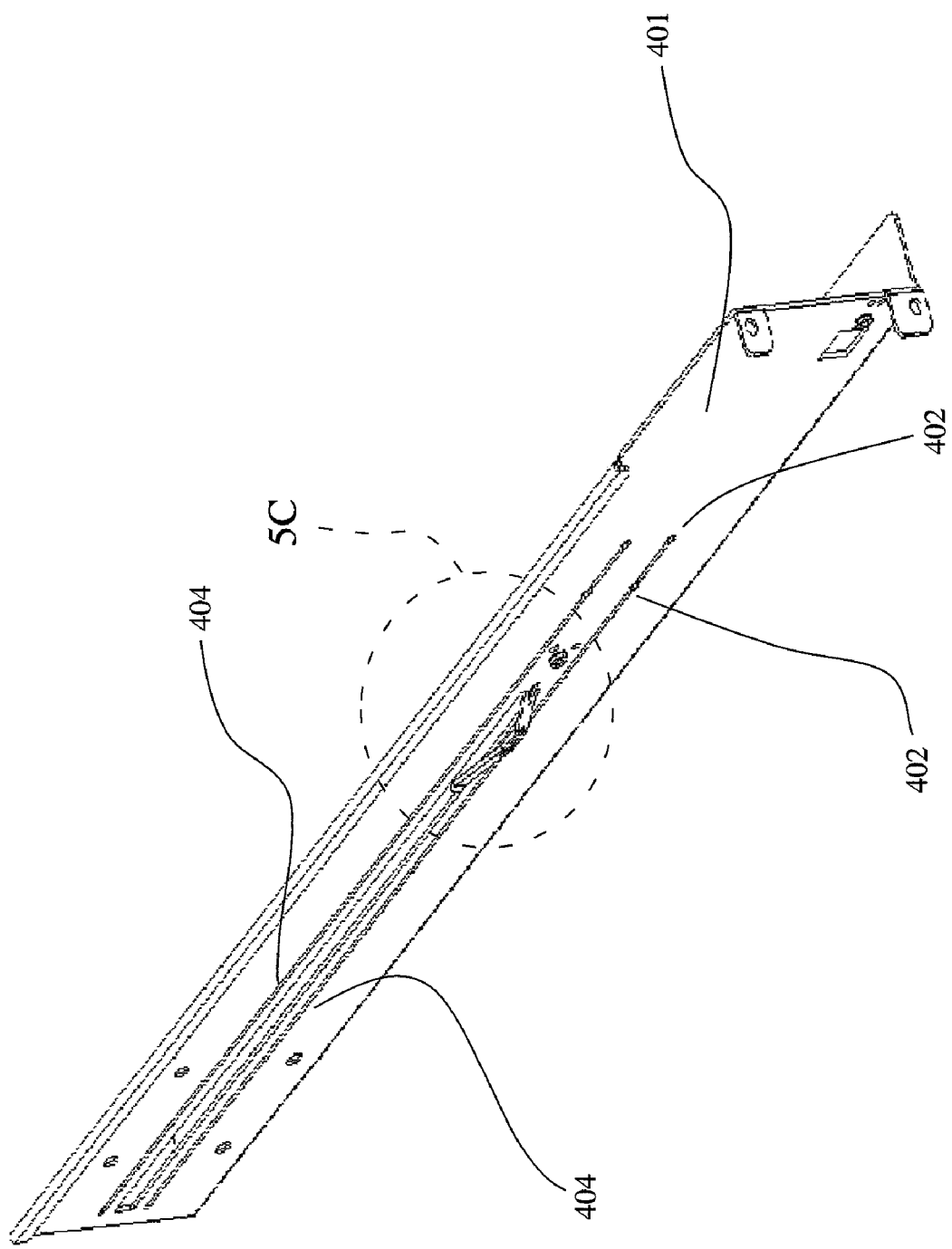
FIGS. 5A to 5B are perspective views of the support according to the embodiment of the present invention.
Figure 5B:
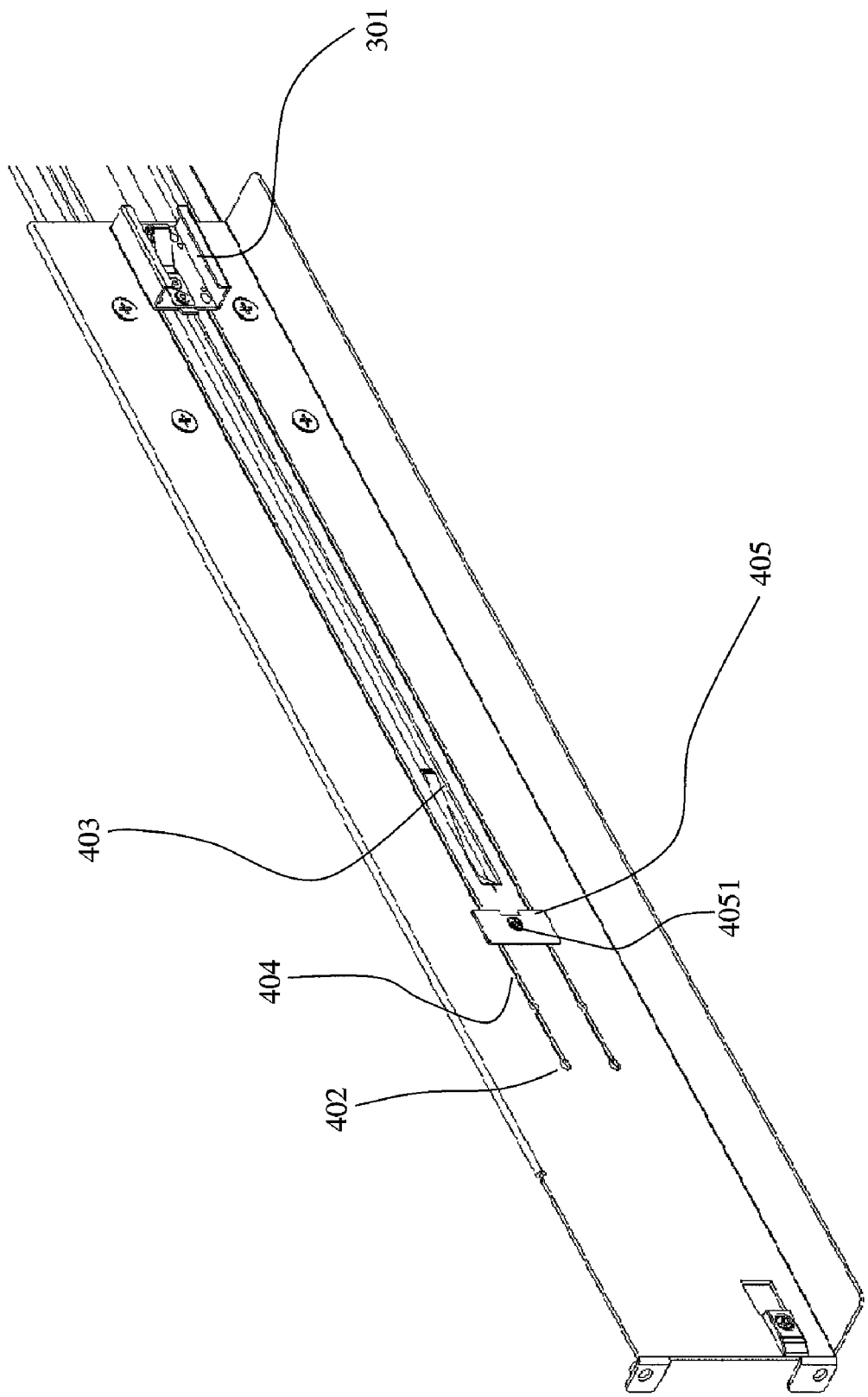
Figure 5C:
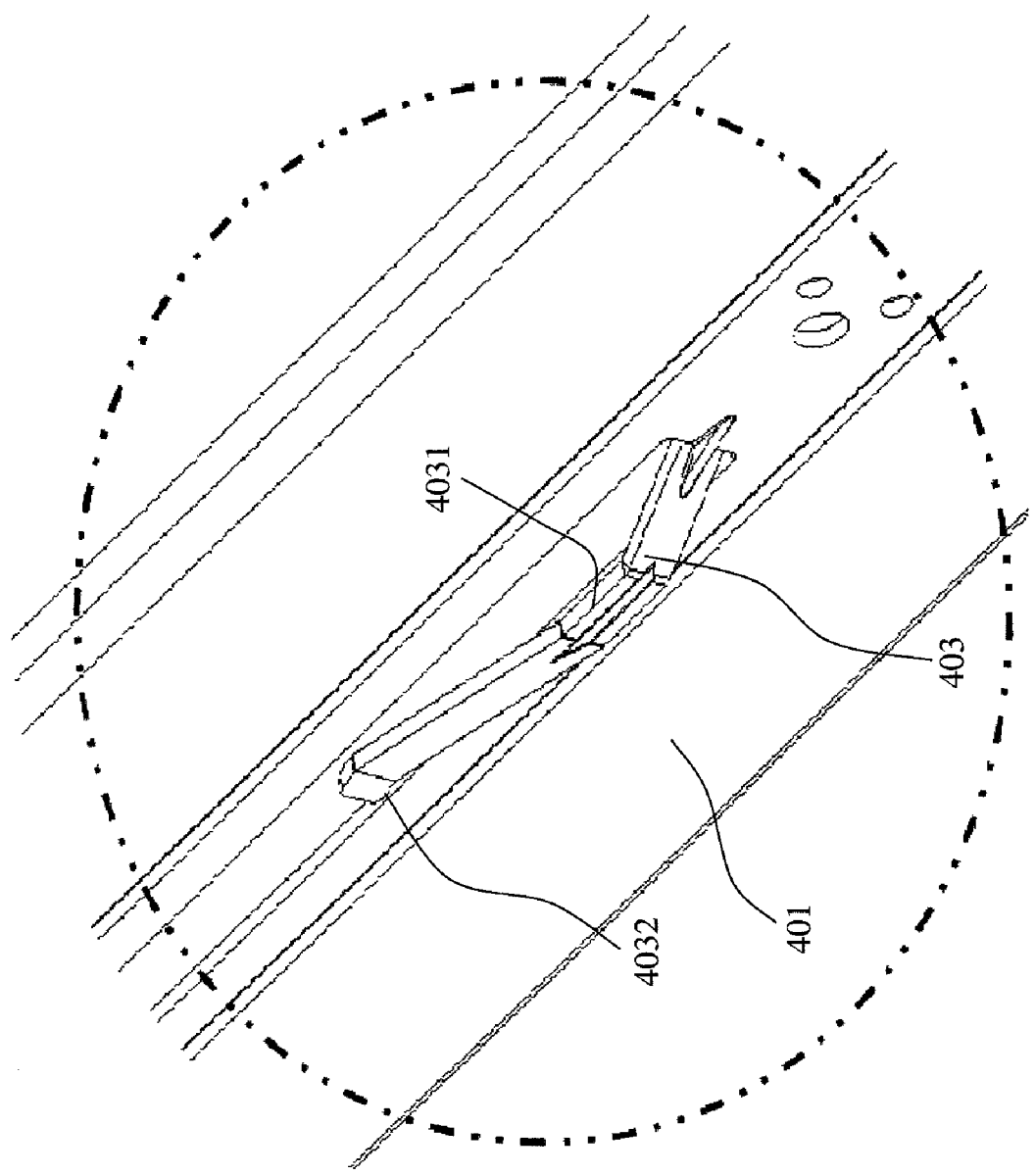
FIG. 5C is an enlarged partial view of FIG. 5A.

Reference is made to FIGS. 5A, 5B, and 5C, which are respectively the perspective views of the support 401 and the enlarged partial view of FIG. 5A of the present invention. The support 401 has a hole 402, a first retaining portion 403 (such as a V-shaped guide pin 403), a first slidable connecting portion 404 (such as trenches 404), and a block 405, wherein the V-shaped guide pin 403 has an end 4032 and a compression portion 4031. The mushroom-shaped guide pins 305 of the slider 301 pass through the hole 402 in order to move back and forth along the trenches 404 on the plane of the support 401. Moreover, a fastening part 4051 (such as a rivet 4051) or a welding way is used to fasten a block 405 on the trench 404 to block the mushroom-shaped guide pins 305, so that the mushroom-shaped guide pins 305 will not escape from the holes 402. In addition, the mushroom-shaped guide pins 305 will not escape from the holes 402 because of the flanges 3051 of the mushroom-shaped guide pins 305. Although in this embodiment of the present invention, the second slidable connecting portion 305 has four mushroom-shaped guide pins 305, in another embodiment of the present invention, the second slidable connecting portion 305 may has only two mushroom-shaped guide pins 305 that could be respectively located on the upper side and lower side, front side and rear side, or in a diagonal manner. In a further embodiment of the present invention, the second slidable connecting portion 305 can be a guide pin with other shapes, such as rectangular guide pin or square guide pin, and the quantity of the rectangular guiding pin or square guiding pin can be one or more than one in order to be retrained into the one or more than one trench(es) 404 in a slidable manner. Therefore, in another embodiment of the present invention, when the second slidable connecting portion 305 is a guide pin, and the first slidable connecting portion 404 is a trench, the quantity of the guiding pin with different types and the trench can be one or more than one. In other embodiment of the present invention, the slider 301 is slidably connected with the support 401 by the second slidable connecting portion 305 that can be a hook-shaped element and the first slidable connecting portion 404 that can be a support edge portion (like the upper edge of the support 401 or the lower edge of the trench 404).

Figure 6A:
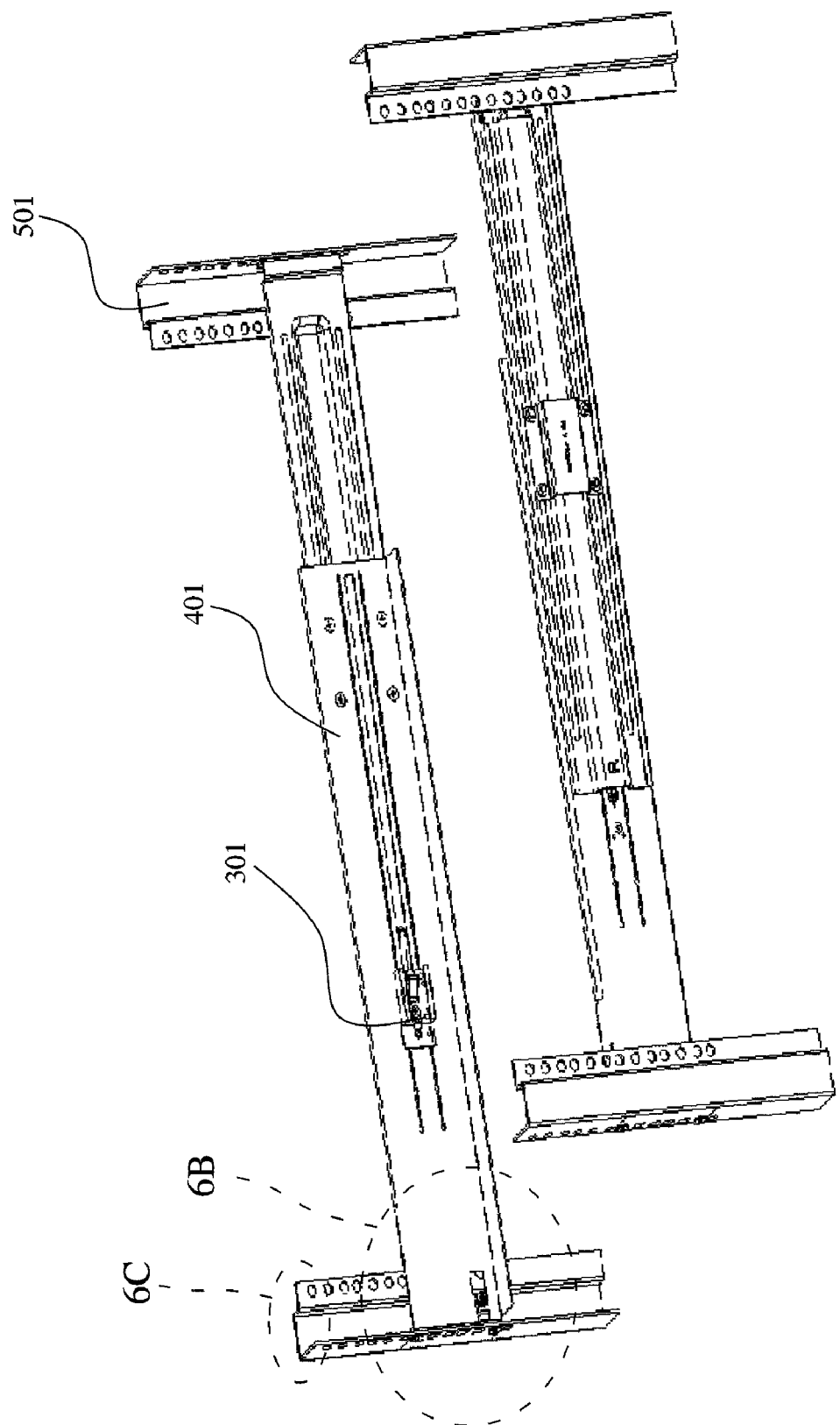
FIGS. 6A to 6B are a perspective view and its enlarged partial view of the stopping block according to the embodiment of the present invention.
Figure 6B:
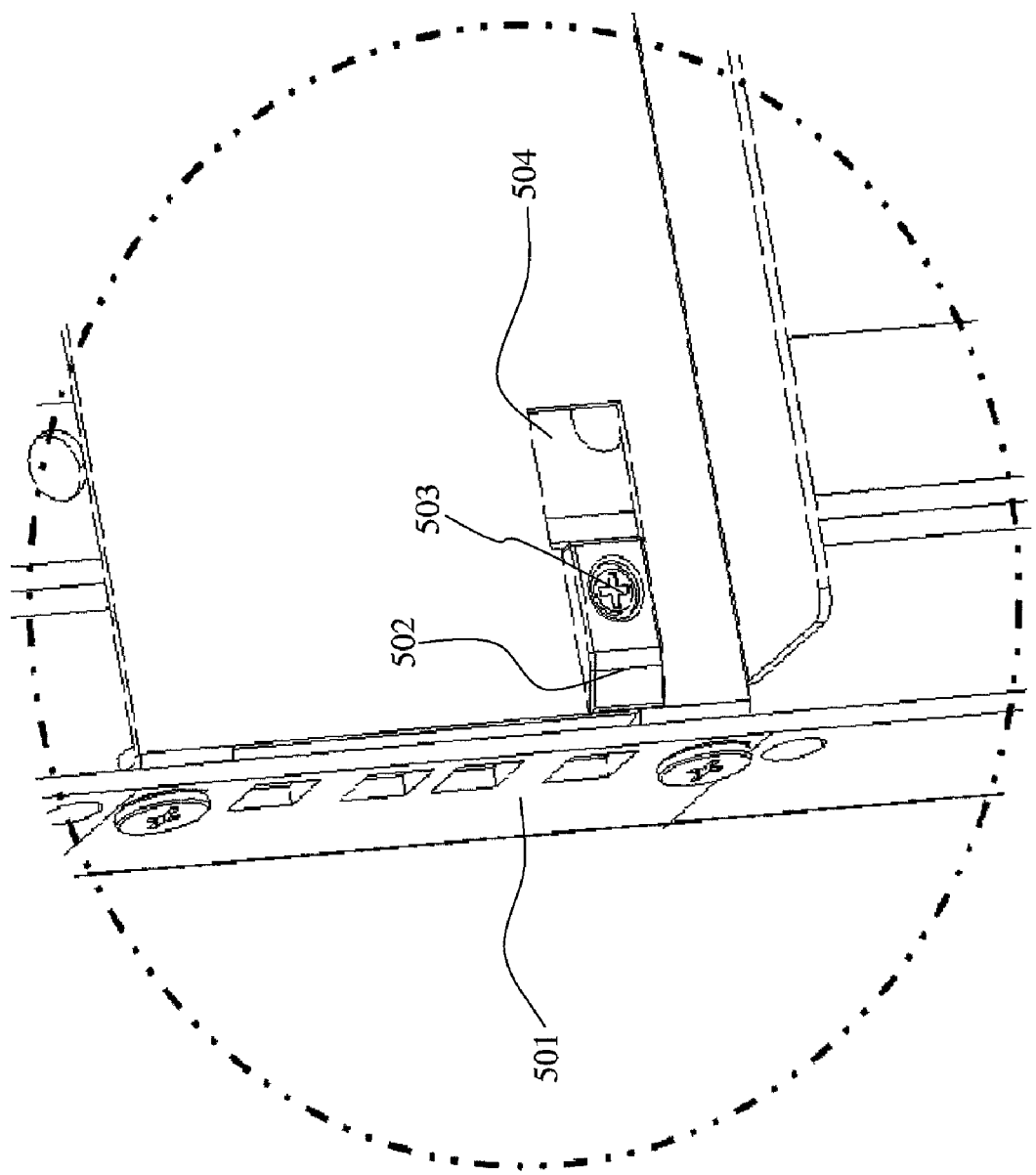
Figure 7A:
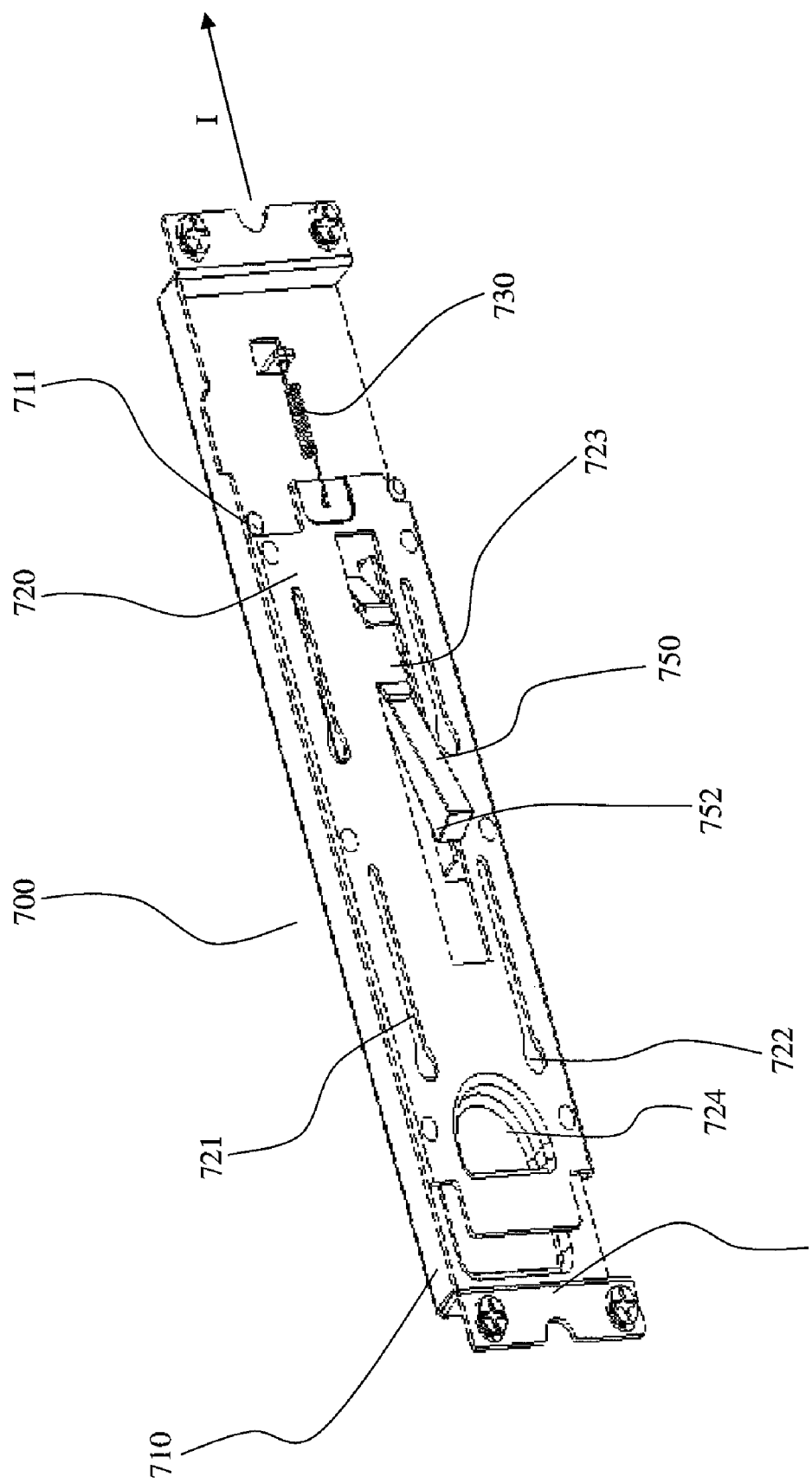
FIGS. 7A to 7B are the diagrams of relative location E and relative location F of the locking mechanism of the present invention respectively.
Figure 7B:
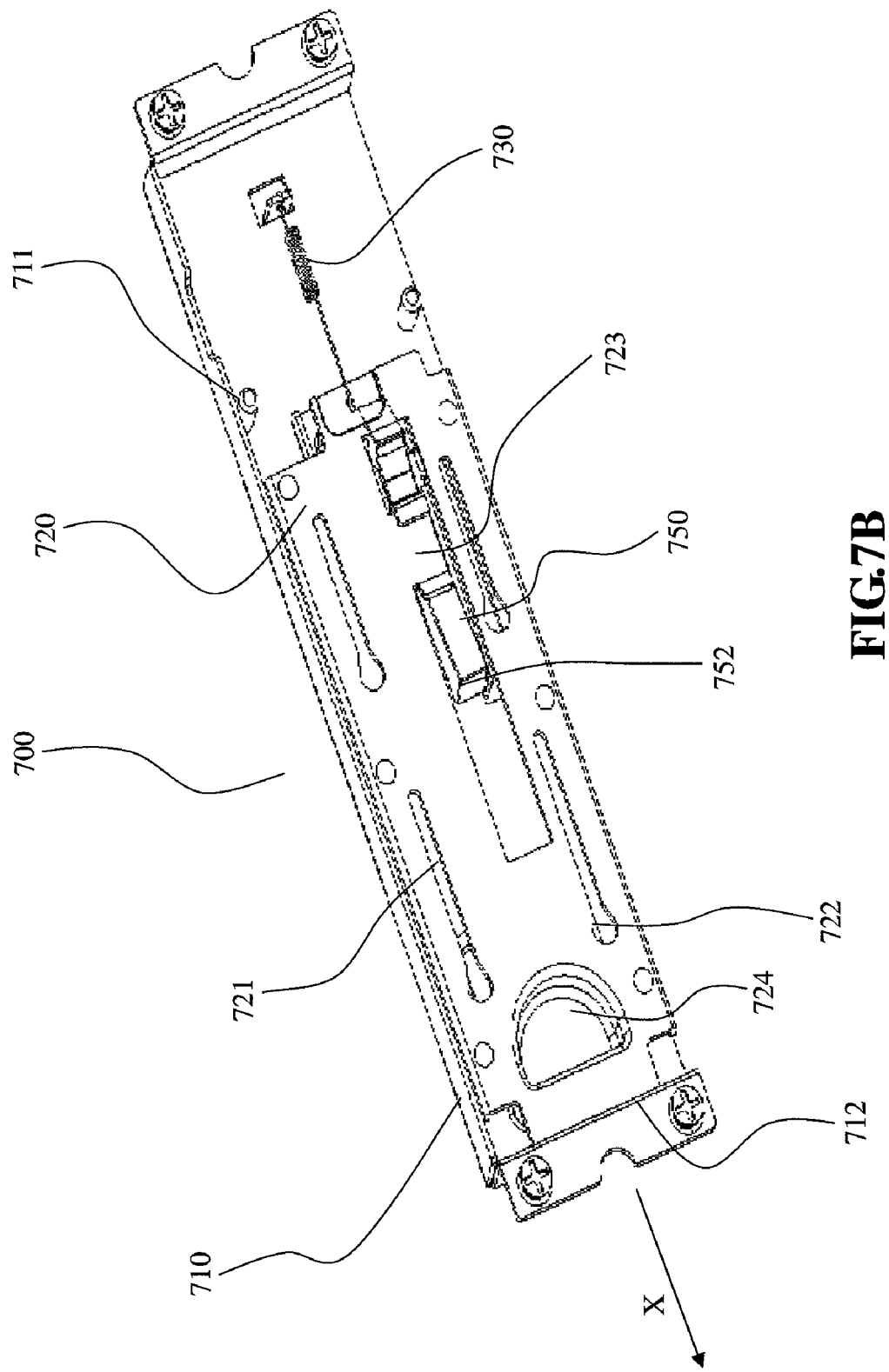
Figure 7C:
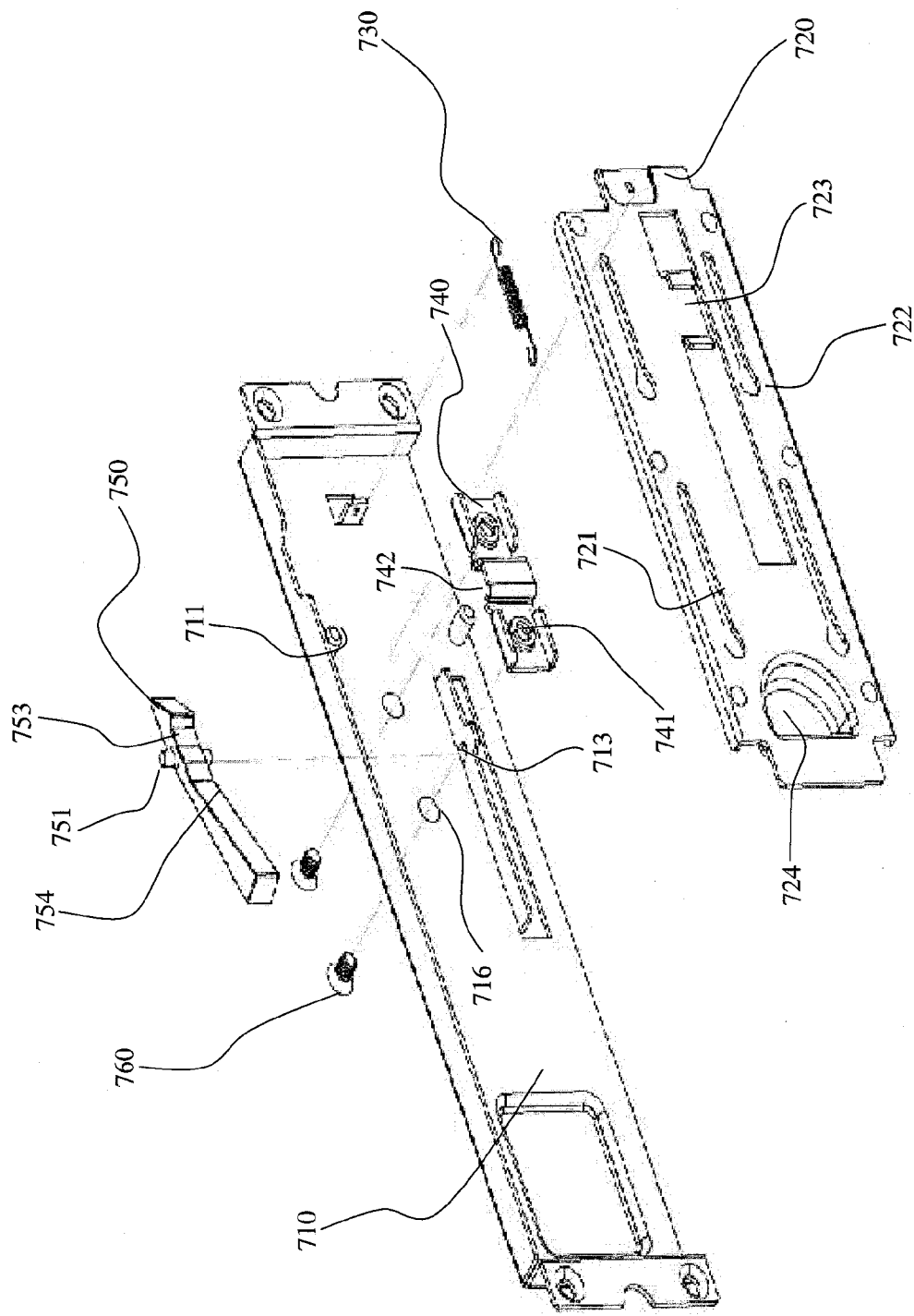
FIGS. 7C to 7F are exploded views and component parts diagrams of the locking mechanism of the present invention.
Figure 7D:
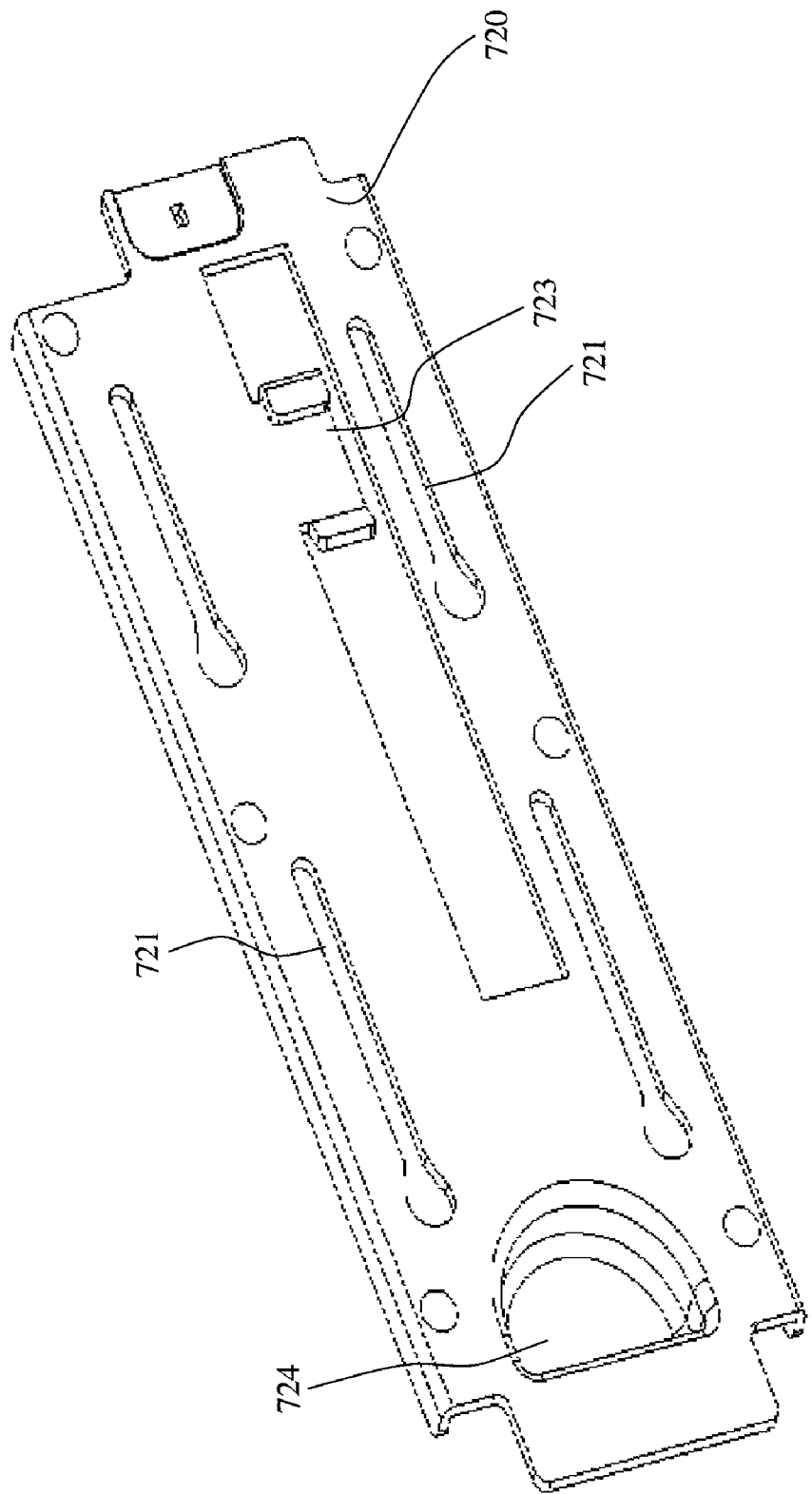
Figure 7E:
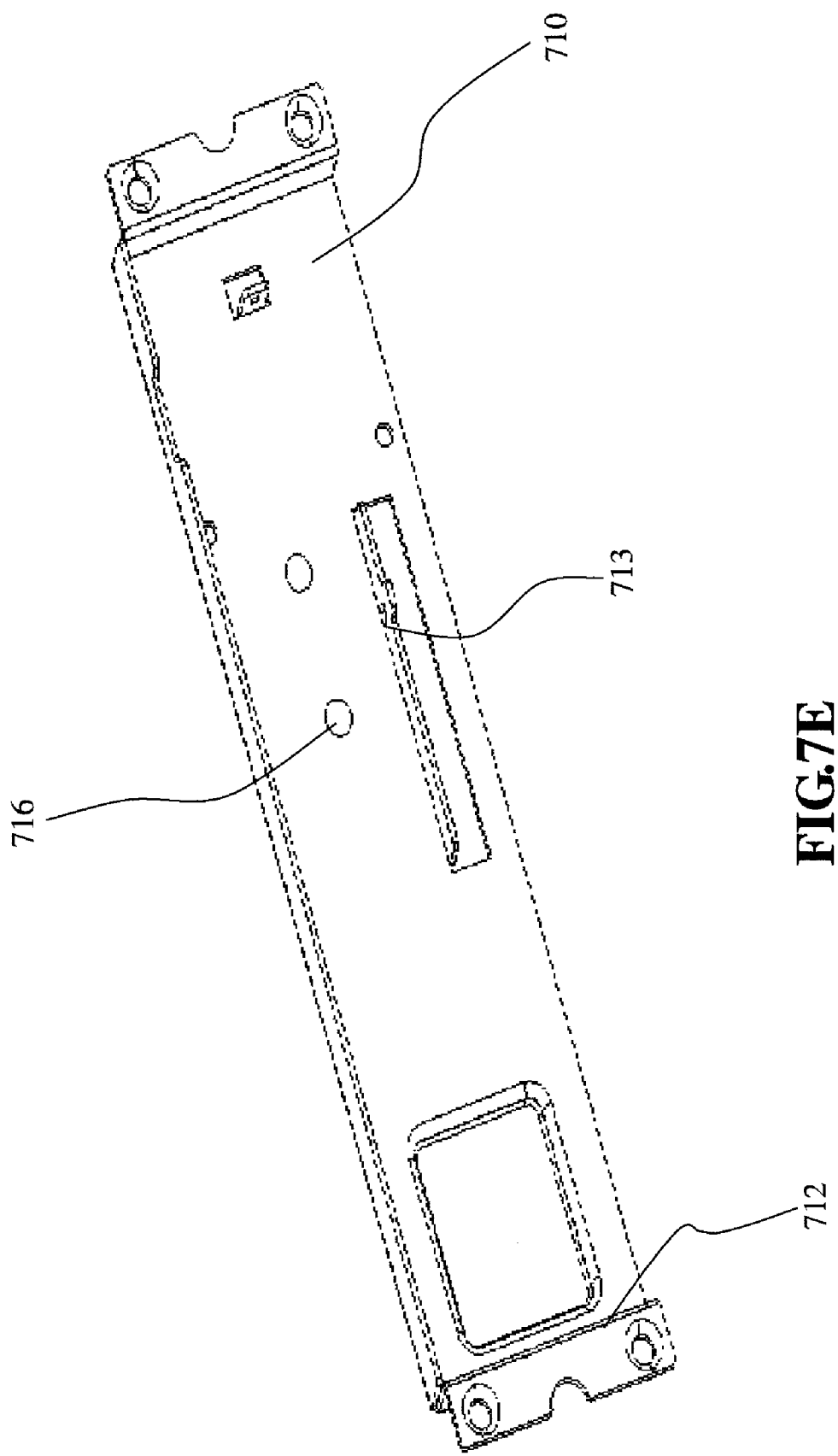
Figure 7F:
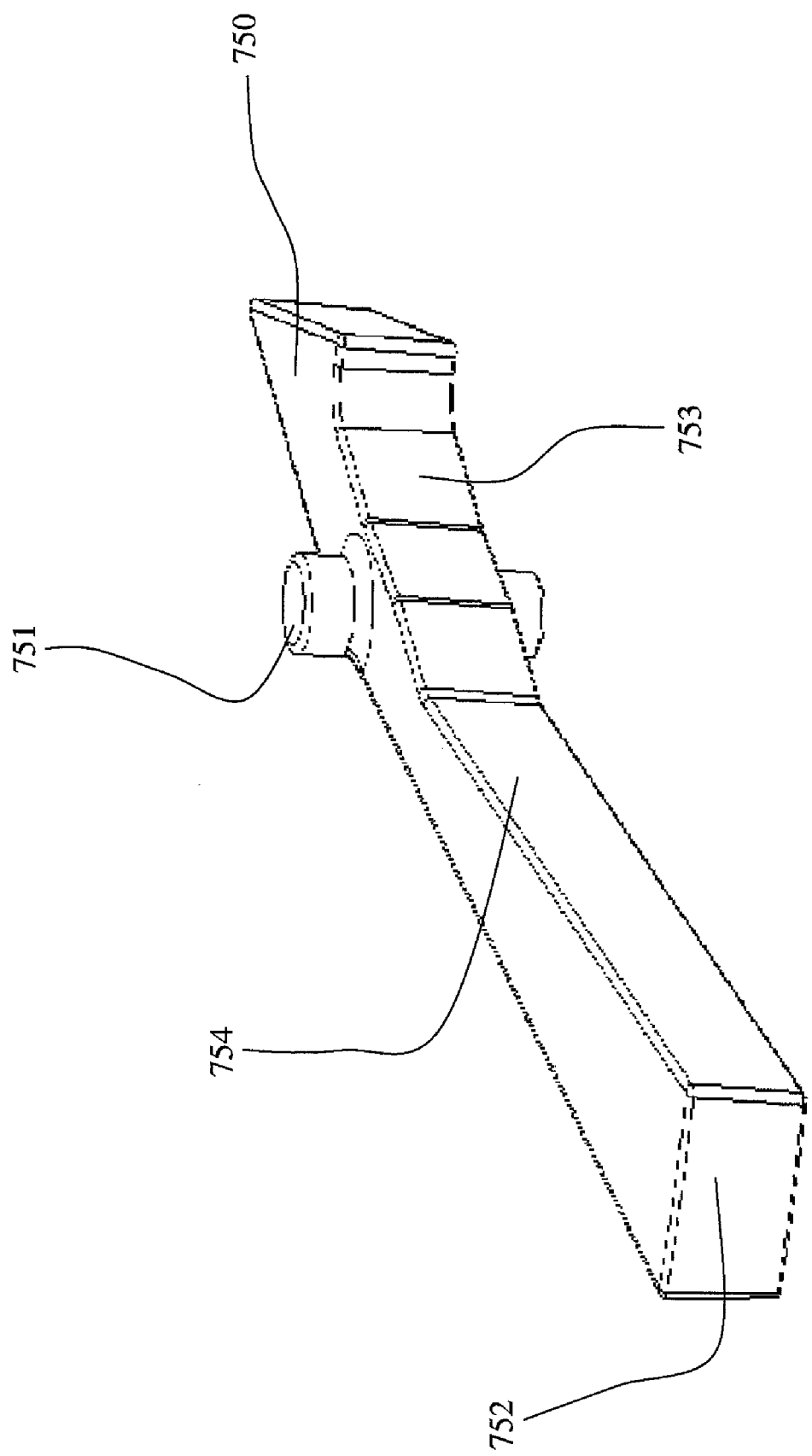
Figure 8:
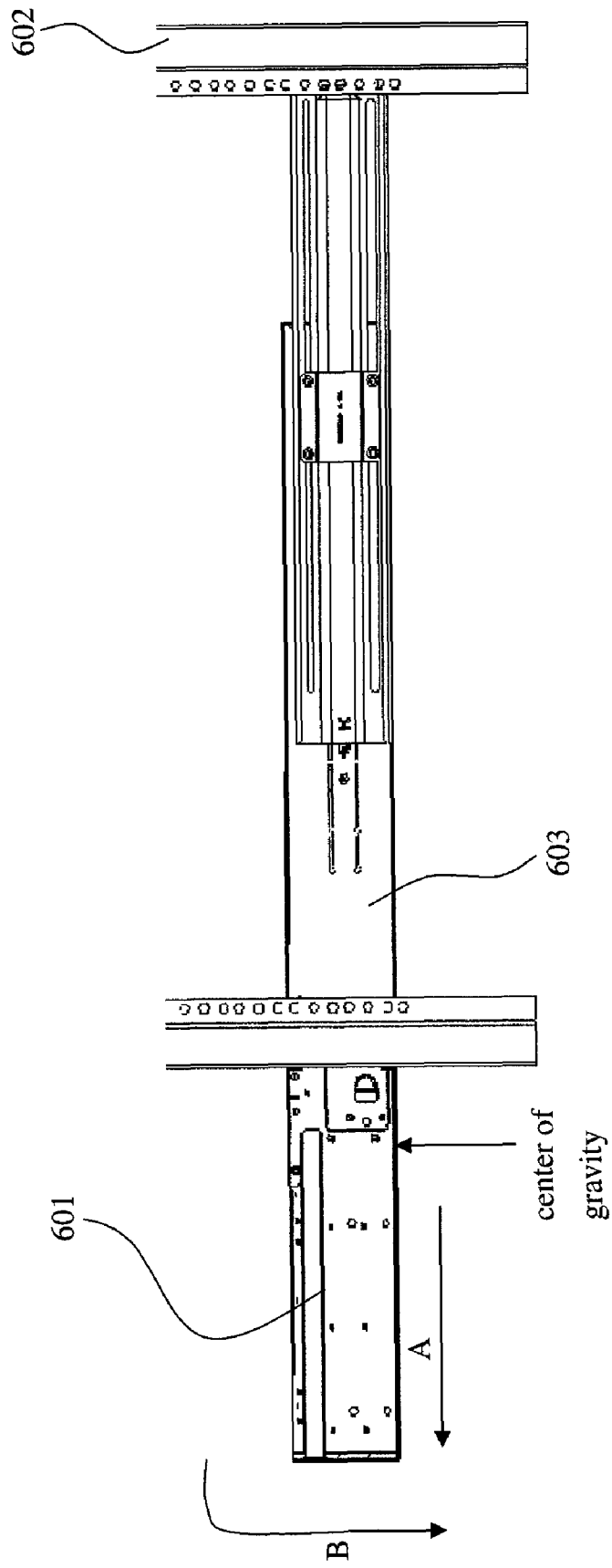
FIG. 8 is a schematic diagram of the prior art.

Besides, when the user directly pulls the enclosure 201 out from the support 401 with careless or too much force, the enclosure 201 will drop to the ground, and the user may get hurt. Therefore, in another embodiment of the present invention, in order to solve aforesaid problem, a locking mechanism 700 is located between the rack 200 and the enclosure 201 as shown in FIGS. 6A to 6C of the present invention. The rack 200 has a plurality of supporting posts 501 that vertically stand on the ground, and there is a support 401 between two supporting posts 501 that are located on front side and rear side, wherein there is a stopper 502 that is fastened on the inner side of the support 401 by a fixing piece 503 (such as a screw 503) or a welding way. The above methods are examples, and not used to limit the scope of the present invention. Additionally, there is a hole 504 that is close to the stopper 502. The detailed descriptions and function of each element are as follows:

Reference is made to FIGS. 7A to 7F, which are respectively the perspective views, exploded perspective view, and component parts diagrams of the locking mechanism 700 of the present invention. FIGS. 7A and 7B are perspective views of the parts that are located at a relative location E and a relative location F respectively. The locking mechanism 700 includes a base 710, a slidable plate 720, a spring 730, and a V-shaped stopping rod 750 that is fastened on the side surface in a pivoting way and that has an end 752. Here, the end 752 extends out or draws back inward in order to determine whether to get contact with the stopper 502 or not, and the slidable plate 720 can moves back and forth on the side surface of the base 710. Therefore, through moving the slidable plate 720 back and forth on the base 710, the end 752 of the V-shaped stopping rod 750 can be controlled to extend out or draw back inwards. Moreover, in a normal status, the spring 730 is used for hooking the slidable plate 720 to make the slidable plate 720 and the base 710 at the relative location E, so that the end 752 of the stopping rod 750 extends out to the first angle location.

In FIG. 7A, when the locking mechanism 700 is located at the relative location E, the elastic part 730 (such as the spring 730) is used for hooking the slidable plate 720 to move in the direction of arrow I that is relative to the base 710, and finally, the slidable plate 720 abuts against the blocking pillar 711 of the base 710 and does not move anymore because of the blocking pillar 711. In addition, in FIG. 3D, the third slidable connecting portion 209 (such as a mushroom-shaped guide pins 209) can pass through the holes 722 (in FIG. 7A) and moves back and forth in the fourth slidable connecting portion 721 (such as trenches 721 in FIG. 7A). Because the mushroom-shaped guide pins 209 has flanges 2091, the mushroom-shaped guide pins 209 will move back and forth along the direction of arrow I, and does not escape from the trenches 721. In addition, at the relative location E, the slidable plate 720 is pulled according to the direction of arrow I through the spring 730, so that the squeezing portion 723 of the slidable plate 720 compresses the first contact surface 753 (FIG. 7F) of the V-shaped stopping rod 750 to make the end 752 of the V-shaped stopping rod 750 extend out, at the first angle location, from the hole 208 of the enclosure 201 in FIG. 3D.

In FIG. 7B, the blocking mechanism 700 is located at the relative location F. The user, by using his or her fingers, hooks the groove 724 of the slidable plate 720 through the hole 207 of the enclosure 201 in FIG. 3D to pull the slidable plate 720 along the direction of arrow X that is relative to the base 710 until the slidable plate 720 abuts against the inner edge 712 of the base 710, and thus does not move any more, so that the squeezing portion 723 of the slidable plate 720 compresses the second contact surface 754 (FIG. 7F) of the V-shaped stopping rod 750 in order to make the end 752 of the V-shaped stopping rod 750 draw inward at the second angle location.

Reference is made to FIGS. 7C to 7F, which are the exploded perspective view of component parts and diagram of component parts of the locking mechanism 700 of the present invention. The V-shaped stopping rod 750 is rotatably fastened on the side surface of the base 710 by a pivoting way. That is to say, one of the two pivots 751 of the V-shaped stopping rod 750 is inserted into the hole 713 of the base 710, and the other of the two pivots 751 is inserted into the semi-circular-shaped hole 742 of a pivot fixing piece 740 and thus is pivotably fastened the V-shaped stopping rod 750 on the side surface of the base 710. Next, fastening parts 760 (such as screws 760) pass through the holes 716 in order to screw into the screw holes 741 of the pivot fixing piece 740, on the side surface of the base 710. The above fastening way is taken for example, and not limited herein. The spring 730 is used for hooking the slidable plate 720 to make the slidable plate 720 abut against the blocking pillar 711, and thus the slidable plate 720 does not move any more; therefore, the squeezing portion 723 of the slidable plate 720 compresses the first contact surface 753 of the V-shaped stopping rod 750, and through using the pivot 751 as a support point, makes the end 752 of the V-shaped stopping rod 750 extend out. On the contrary, the user hooks the groove 724 of the slidable plate 720 by using his or her fingers to move slidable plate 720 along the direction of arrow X in FIG. 7B until the slidable plate 720 abuts against the inner edge 712 of the base 710, and thus does not move any more. Because the squeezing portion 723 of the slidable plate 720 compresses the second contact surface 754 of the V-shaped stopping rod 750, and through using the pivot 751 as a support point, makes the end 752 of the V-shaped stopping rod 750 draw inward as shown in FIG. 7B.

FIGS. 1A to 1D and FIGS. 2A to 2K are respectively the exploded perspective views and enlarged partial views of the operation of the sliding rail and the locking mechanism 700 of the present invention. As shown in FIG. 1A and FIG. 2A that is the enlarged partial view of FIG. 1A, they show all component parts at a relative location A of the present invention. For sake of clear explanation and description, only one of the adjustable plates 101 on one side is shown, that is, the adjustable plate 101 on the other side is omitted, so that the detailed operations for each of component parts can be clearly seen. In FIGS. 1A and 2A, part of the vertical support posts 501 and the support 401 of the adjustable plates 101 are merely shown for all of the assembled parts of the rack 200. At the relative location A, there are a plurality of support posts 501, wherein a support 401 is horizontally located between the two sides of the support posts 501 and the support 401 carries the enclosure 201 that is located the most inner location for receiving a plurality of electronic devices. Moreover, the top side 307 of the 7-shaped resilient piece 302 is used to get contact with the inner edge 2051 of the hole 205 of the ear portion 202, so that the ear portion 202 is retained in the interior of the side wall 306 of the slider 301 as shown in FIG. 2A. In addition, when the user draws or moves the enclosure 201 from the rack 200 along the direction of arrow D in FIG. 1A, the top end 307 of the 7-shaped resilient piece 302 of the slider 301 contacts the inner edge 2051 of the hole 205 of the ear portion 202 of the enclosure 201, so that the slider 301 not only moves with the enclosure 201 together but also moves back and forth along the trenches 404 of the supports 401 under being guided by the mushroom-shaped guide pins 305.

Figure 1B:
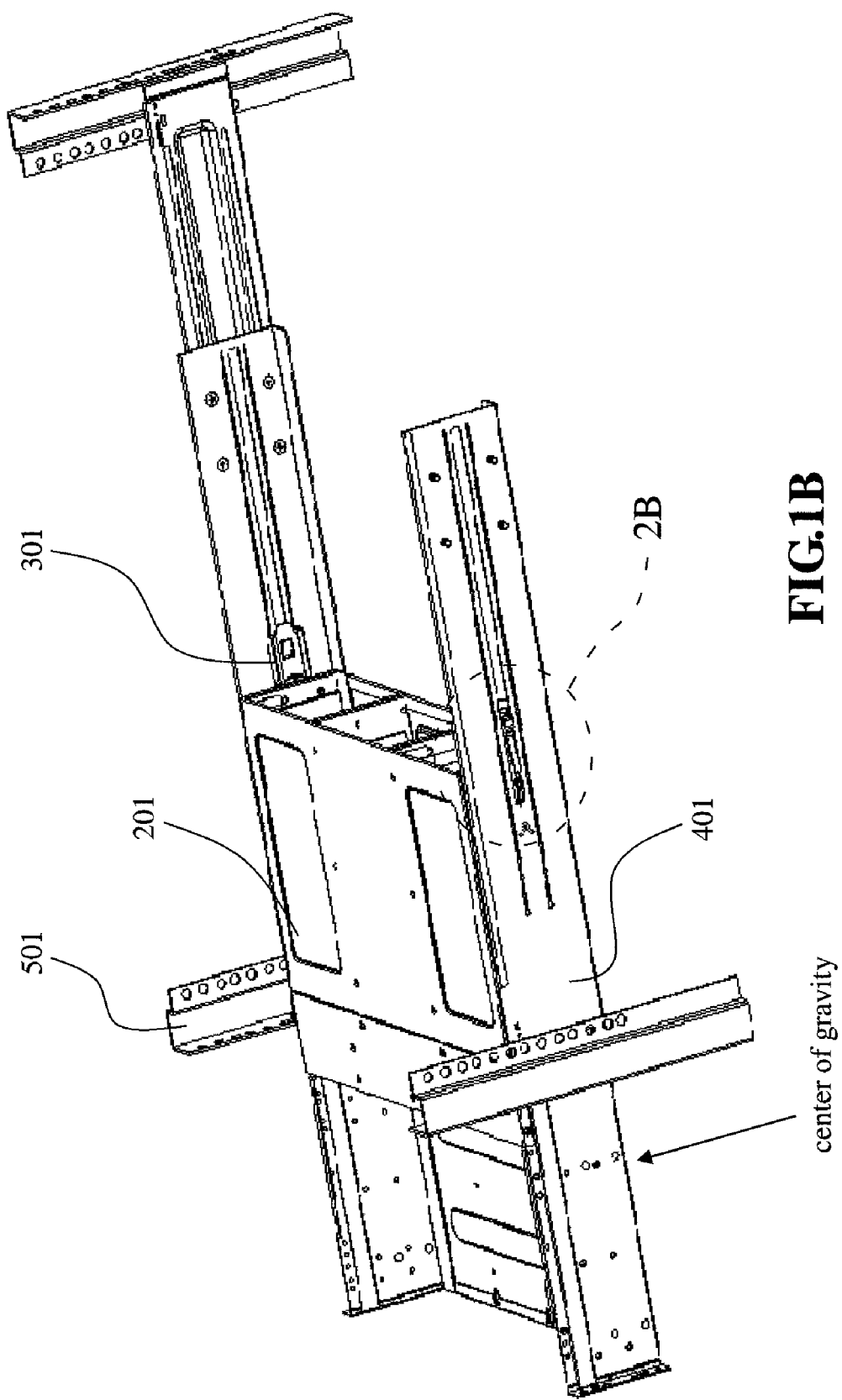
Figure 2A:
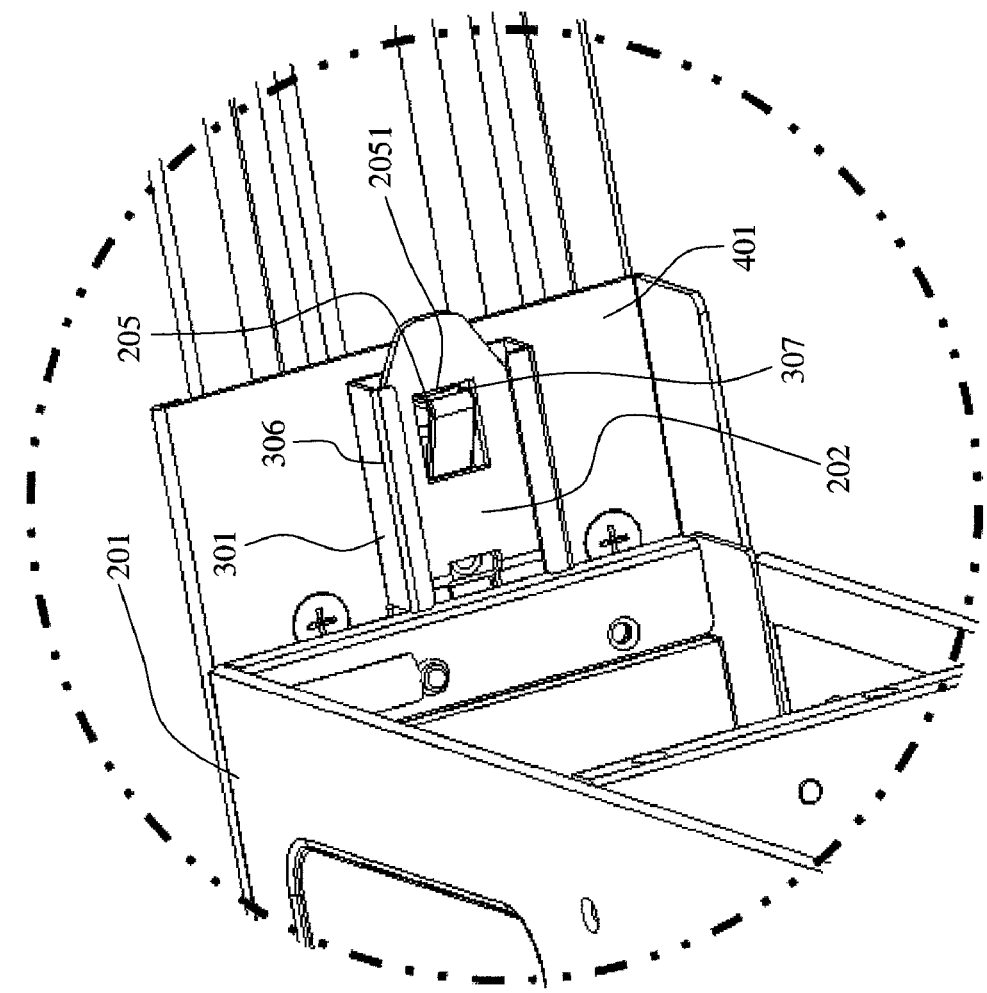
Figure 2B:
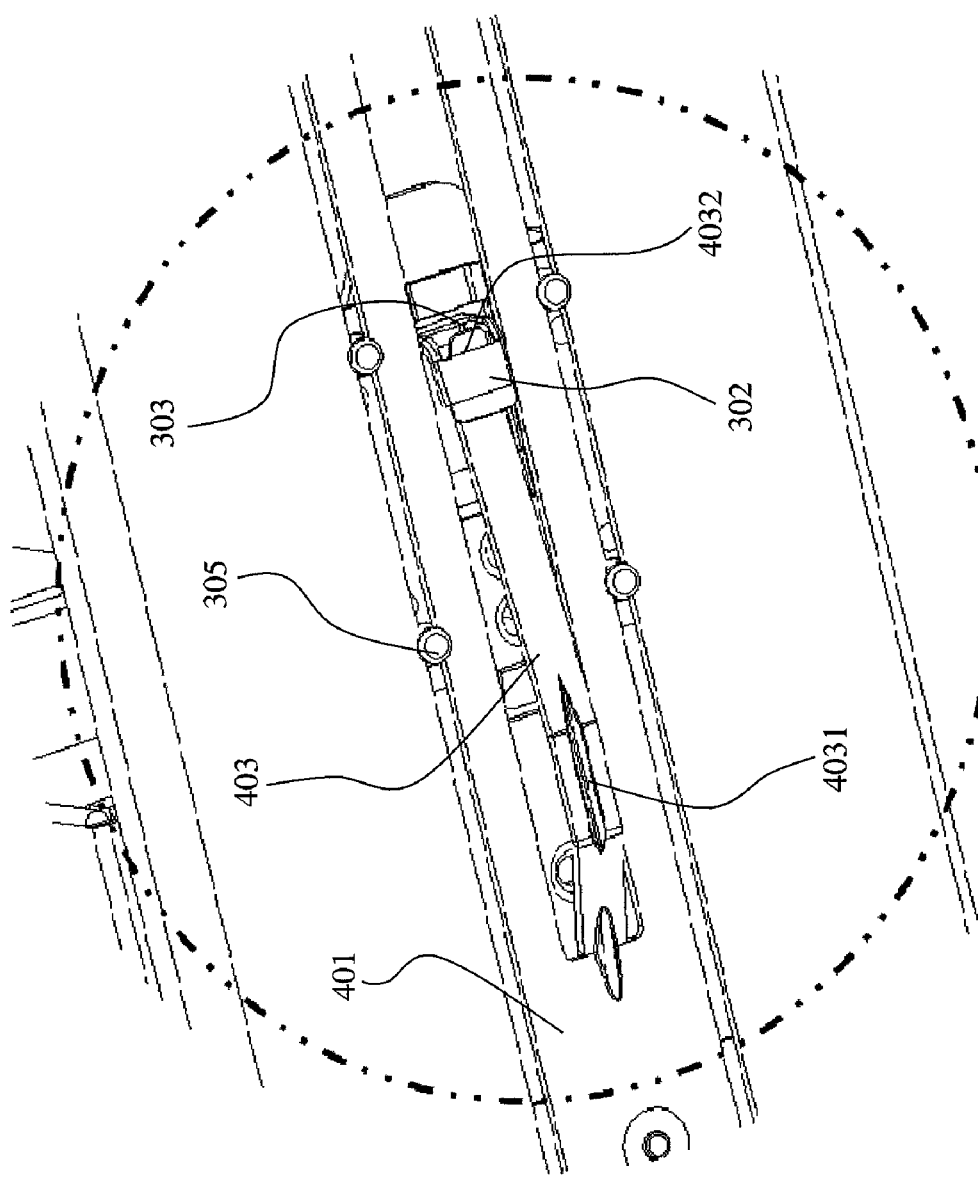

Reference is made to FIG. 1B and its the enlarged partial view FIG. 2B, which show all component parts at the relative location B. At the relative location B, the functions of each of component parts in FIG. 1B and FIG. 2B of the present invention are the same as those of FIGS. 1A and 2A, so that the detailed descriptions of each of component parts in FIG. 1B and FIG. 2B of the present invention are omitted. In FIG. 1B and the enlarged partial view FIG. 2B, the user keeps drawing or moving the enclosure 201 along the direction of arrow D, so that the end 4032 of the V-shaped guide pin 403 of the support 401 passes through the holes 303 of the 7-shaped resilient pieces 302 of the slider 301 in order to make the 7-shaped resilient piece 302 pass through the hole 303, as shown in FIG. 2B. Furthermore, because the ear portion 202 of the enclosure 201 is tightly retained in the slider 301, and the mushroom-shaped guide pins 305 of the slider 301 are slidably retained in the trenches 404 of the support 401, the enclosure 201 will not turn over and drop to the ground, even though the center of gravity of the enclosure 201 surpasses the end of the support 401.

Figure 1C:
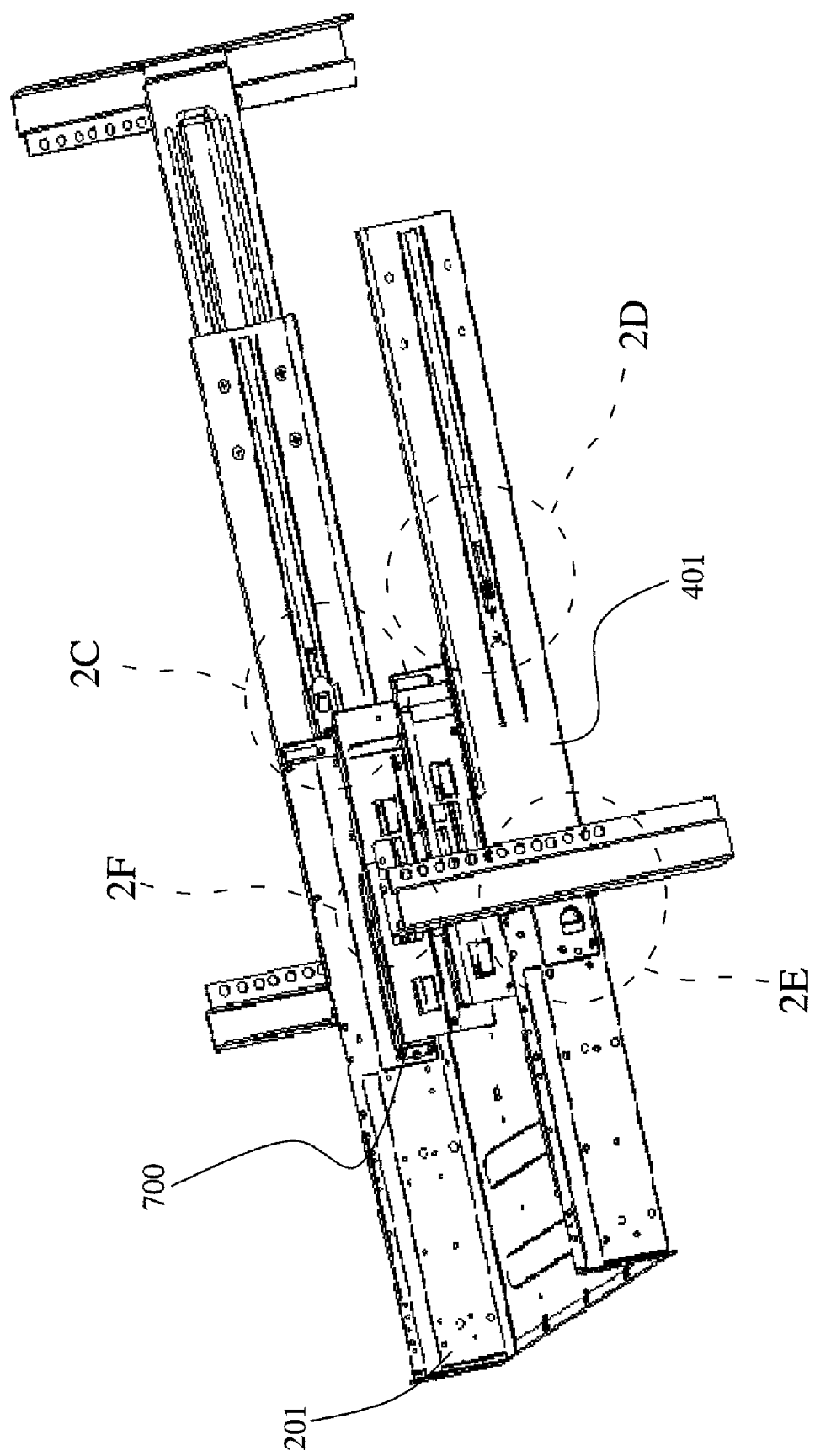
Figure 2C:
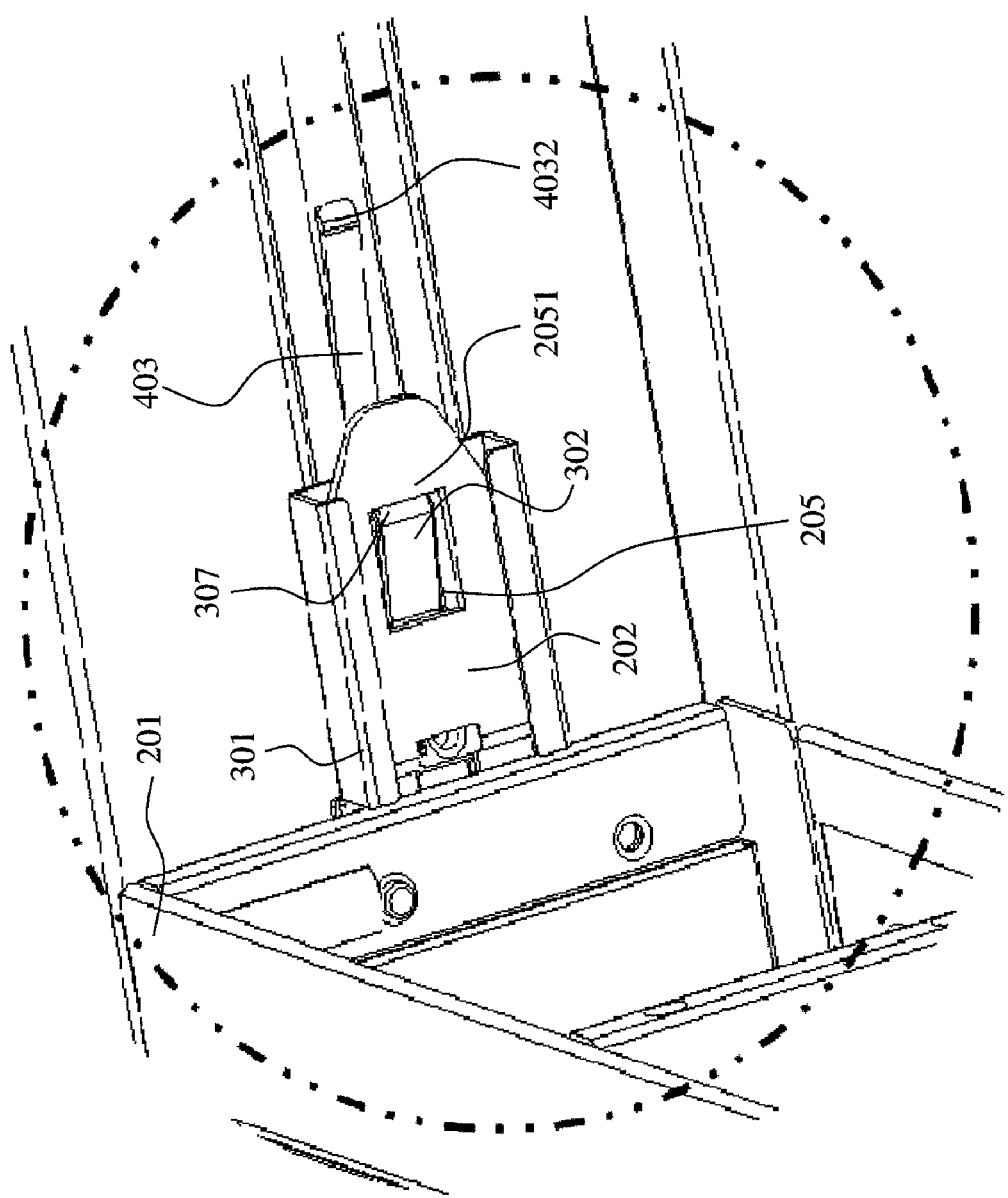
Figure 2E:
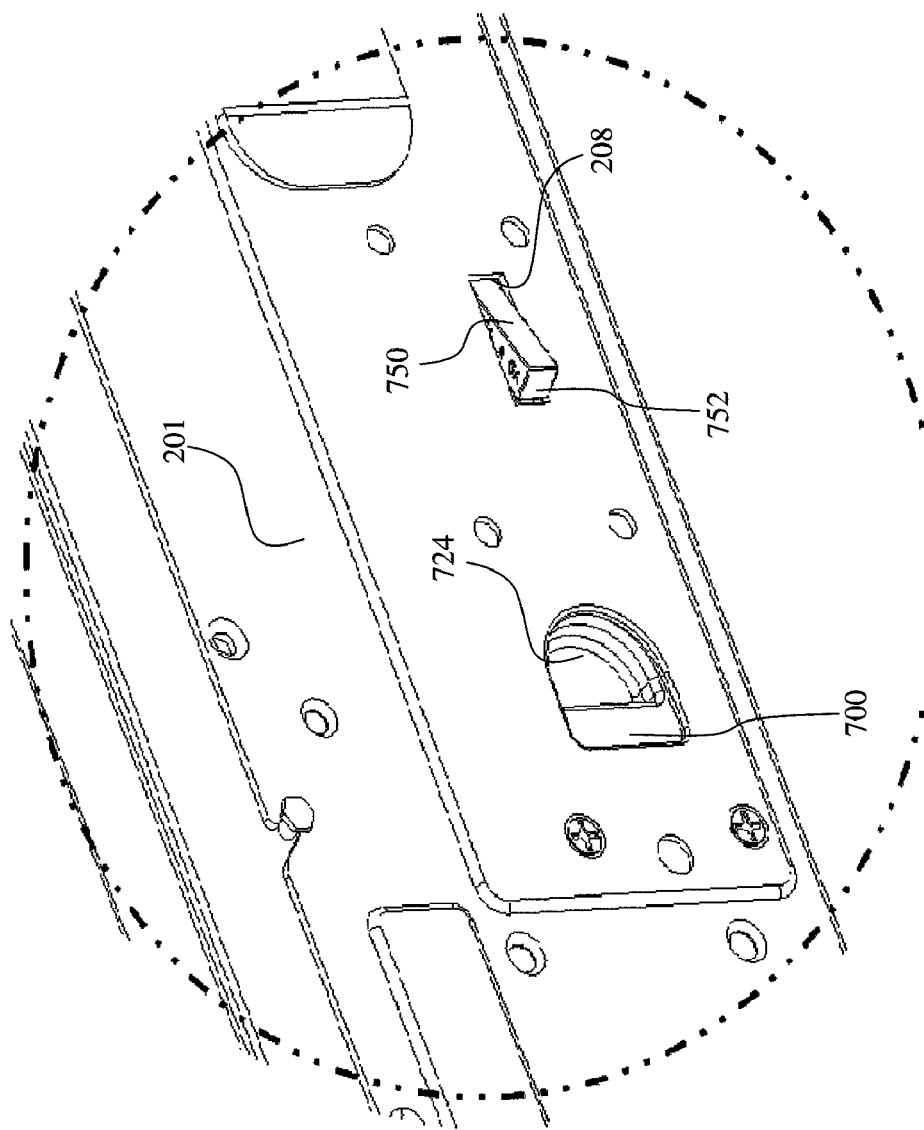

Reference is made to FIG. 1C and its enlarged partial view FIG. 2C to 2F, which show a relative location C of the component parts. At the relative location C, the user keeps drawing or moving the enclosure 201 along the direction of arrow D in FIG. 1A, so that the compression portion 4031 of the V-shaped guide pin 403, where the compression portion 4031 has already been inserted in the hole 303, contacts the inner edge of the hole 303 of the 7-shaped resilient piece 302 and thus compresses the top end 307 of the 7-shaped resilient piece 302 to move along the direction of arrow E in FIG. 2D until the top end 307 of the 7-shaped resilient piece 302 does not get in contact with the inner edge 2051 of the hole 205 of the ear portion 202, as shown in FIGS. 2C and 2D. When at the relative location C or when the enclosure 201 moves a certain distance along the direction of arrow D that is relative to the support 401, because the locking mechanism 700 blocks the enclosure 201, the enclosure 201 does not move along the direction of arrow D any more as shown in FIGS. 2E and 2F, that is to say, the enclosure 201 does not move along the direction of arrow D any more, even though the user keeps drawing or moving the enclosure 201 along the direction of arrow D. In FIG. 2E, the supporting post 501 is omitted in order to clearly show the operations of the component parts of the locking mechanism 700. As the locking mechanism 700 of the present invention in FIG. 7A shows, because the slidable plate 720 keeps being pulled by a force exerted by the spring 730 along the direction of arrow I, the squeezing portion 723 of the slidable plate 720 compresses the first contact surface 753 of the V-shaped stopping rod 750, so that the end 752 of the V-shaped stopping rod 750 passes through the hole 208 of the enclosure 201 and is kept in the status where the end 752 extends out at the first angle location. When the user keeps drawing or moving the enclosure 201, the end 752 of the V-shaped stopping rod 750 is in the status where the end 752 extends out at the first angle location, so that the end 752 of the V-shaped stopping rod 750 gets contact with the stopper 502 of the support 401. Moreover, part of the end 752 of the V-shaped stopping rod 750 enters into the hole 504 (as shown in FIGS. 2F and 6B) and gets contact with the stopper 502 of the support 401 in order to make the enclosure 201 still.

Figure 2G:
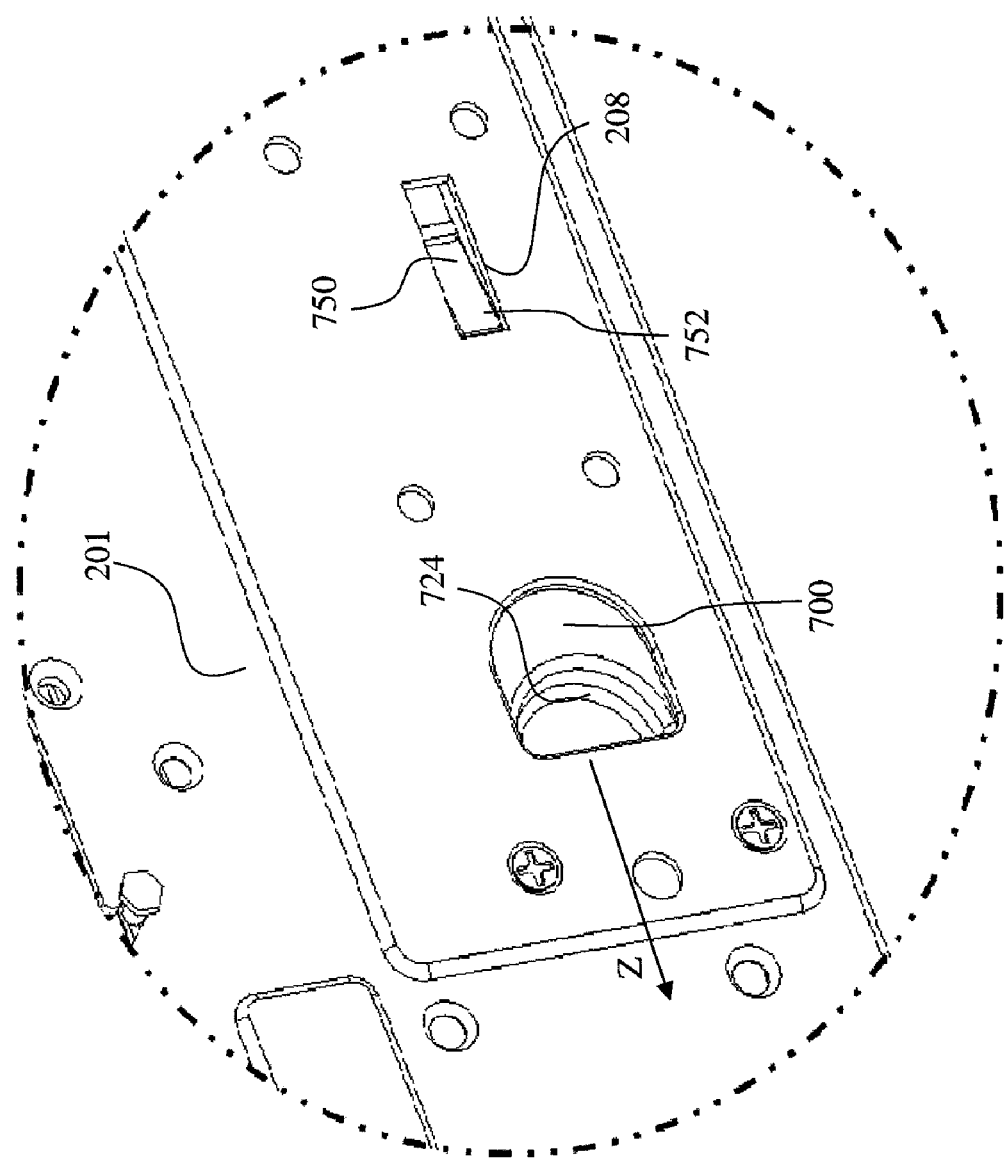
Figure 2H:
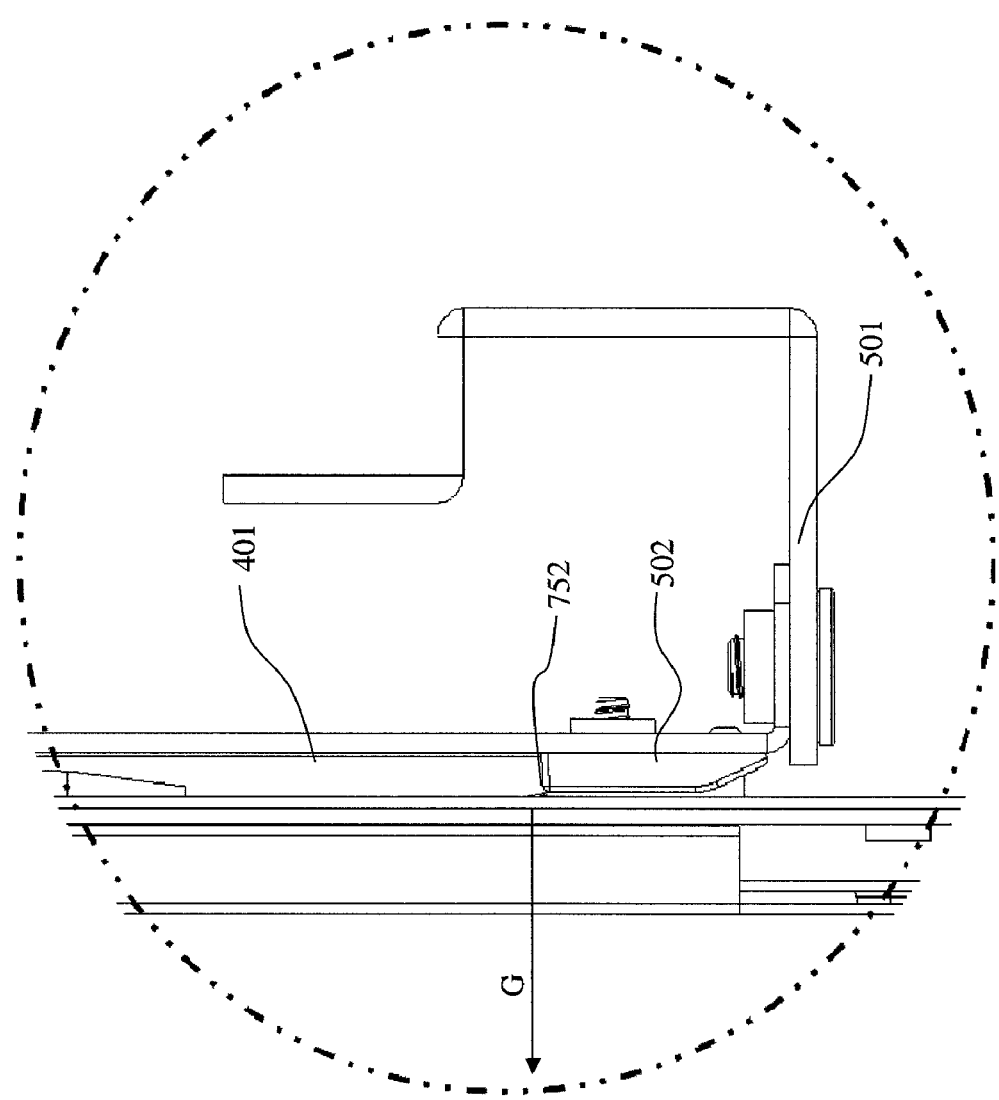

When the user needs to fully draw or move the enclosure 201 out from the support 401, as shown in FIGS. 2G and 2H, the user hooks the groove 724 of the locking mechanism 700 through the hole 207 of the enclosure 201 by his or her fingers and moves the slidable plate 720 along the direction of arrow Z in FIG. 2G; therefore, the squeezing portion 723 of the slidable plate 720 compresses the second contact surface 754 of the V-shaped stopping rod 750, so that the end 752 draws back inwards along the direction of the arrow G in FIG. 2H and is stopped at the second angle location, where as shown in FIG. 7B, the end 752 does not get contact with the stopper 502 of the support 401. Therefore, the enclosure 201 can be drawn out along the direction of arrow D in FIG. 1A or moved relative to the support 401 because the end 752 of the V-shaped stopping rod 750 passes through the stopper 502.

In another embodiment of the present invention, the locking mechanism 700 can also have a stopping rod 750 that is located on the enclosure 201 or a base 710, and that is pivotably rotated between a first angle location and a second angle location. The locking mechanism 700 is located on the enclosure 201 or the base 710 by using an actuating element, and is actuated between a third angle location and a fourth angle location to respectively actuate the stopping rod 750 between the first angle location and the second angle location, wherein the slidable connecting piece 202 cannot escape or separate from the support 401 when the stopping rod 750 is located at the first angle location and the slidable connecting piece 202 can escape or separate from the support 401 when the actuating element is located at the second angle location. In a further embodiment of the present invention, an elastic part, such as a spring 730, is located to keep the stopping rod 750 at the first angle location in a normal status, wherein the elastic part can be connected with the actuating part and the enclosure 201 or the base 710. In a further embodiment of the present invention, as long as the locking mechanism 700 cannot make the slidable connecting piece 202 escape or separate from the support 401 in the first status, and the locking mechanism 700 can make the slidable connecting piece 202 escape or separate from the support 401 in the second status, the locking mechanism 700 can be any kind of locking mechanism, such as a locking mechanism with different types.

Figure 1D:
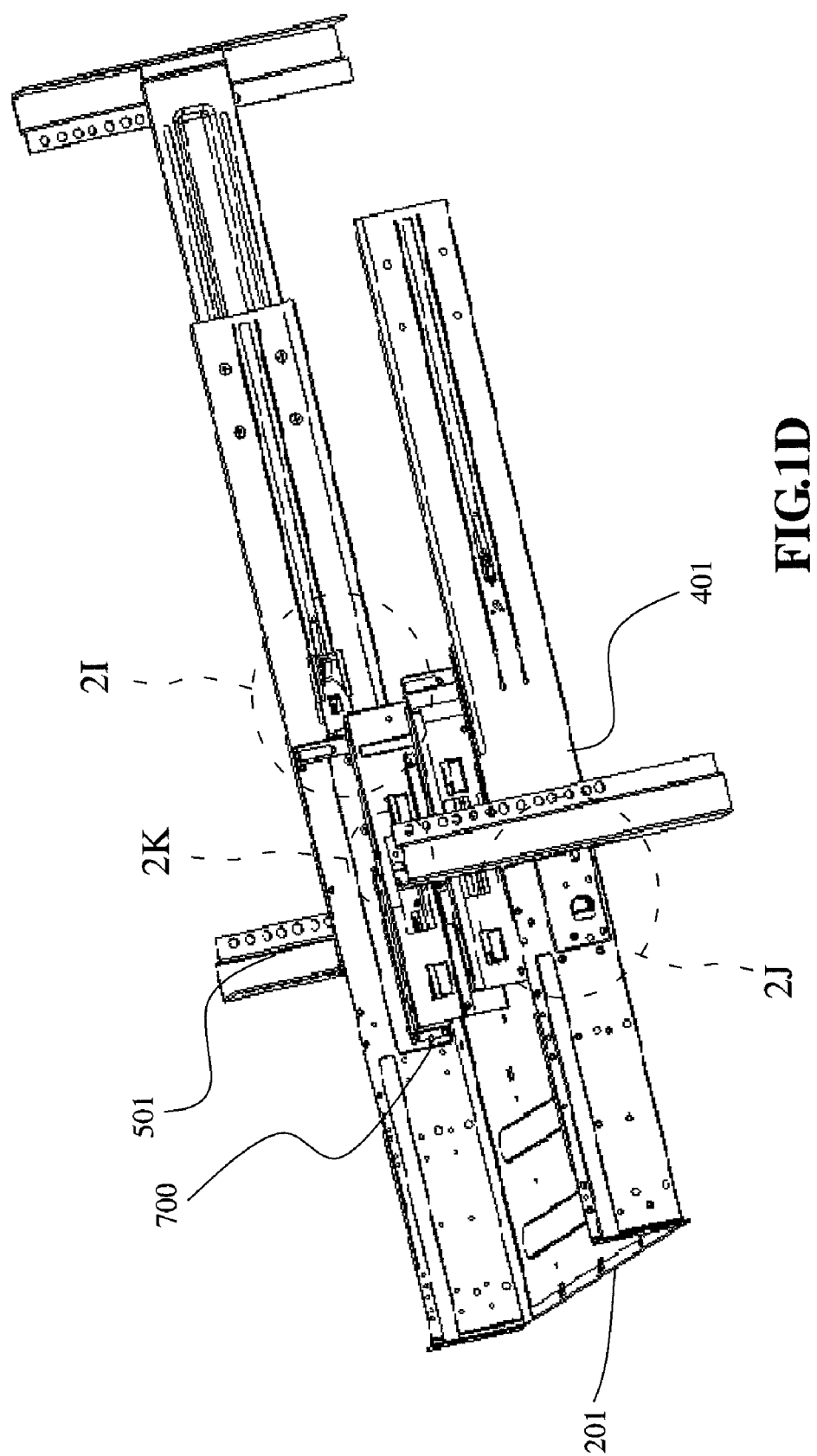
Figure 2I:
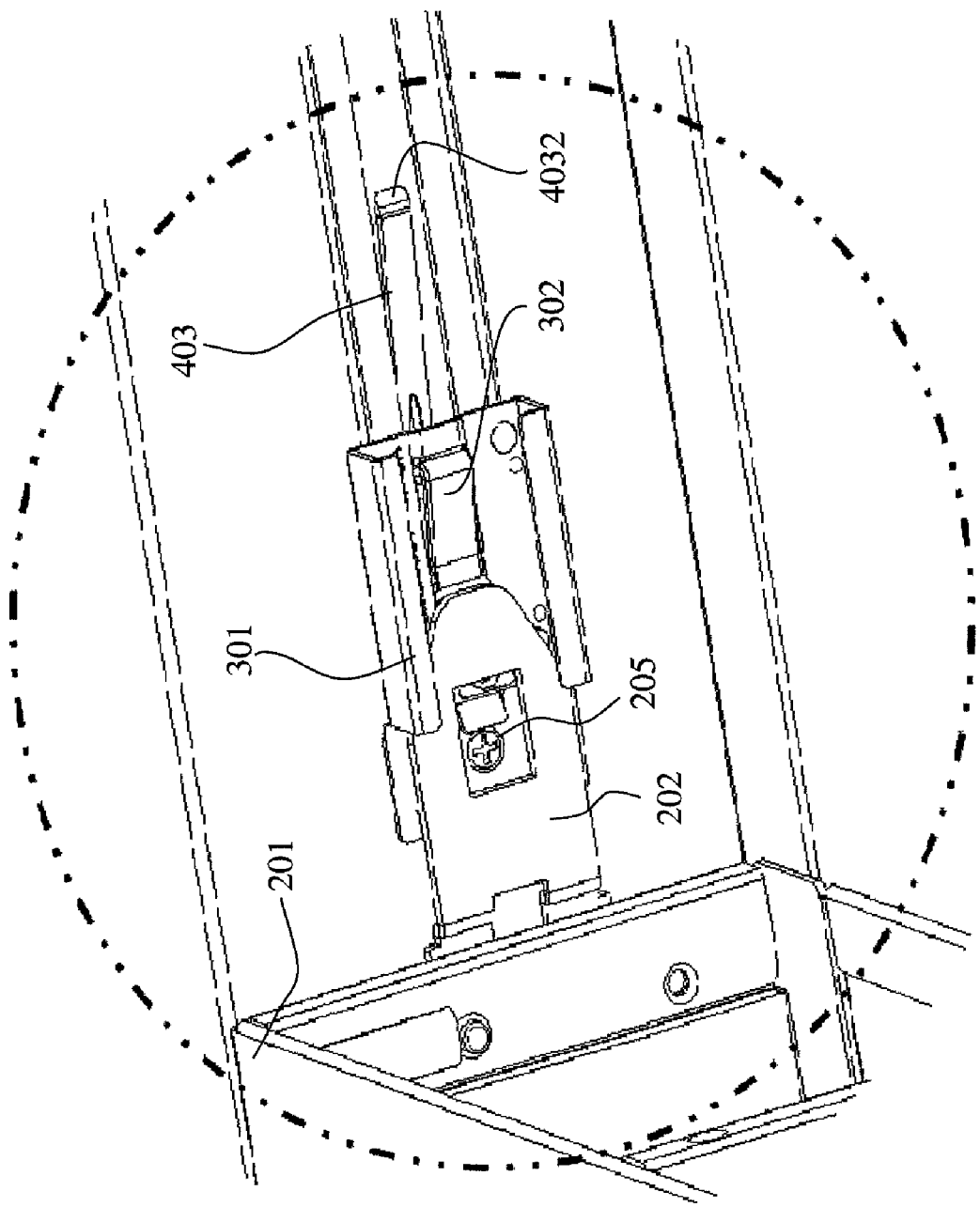
Figure 2J:
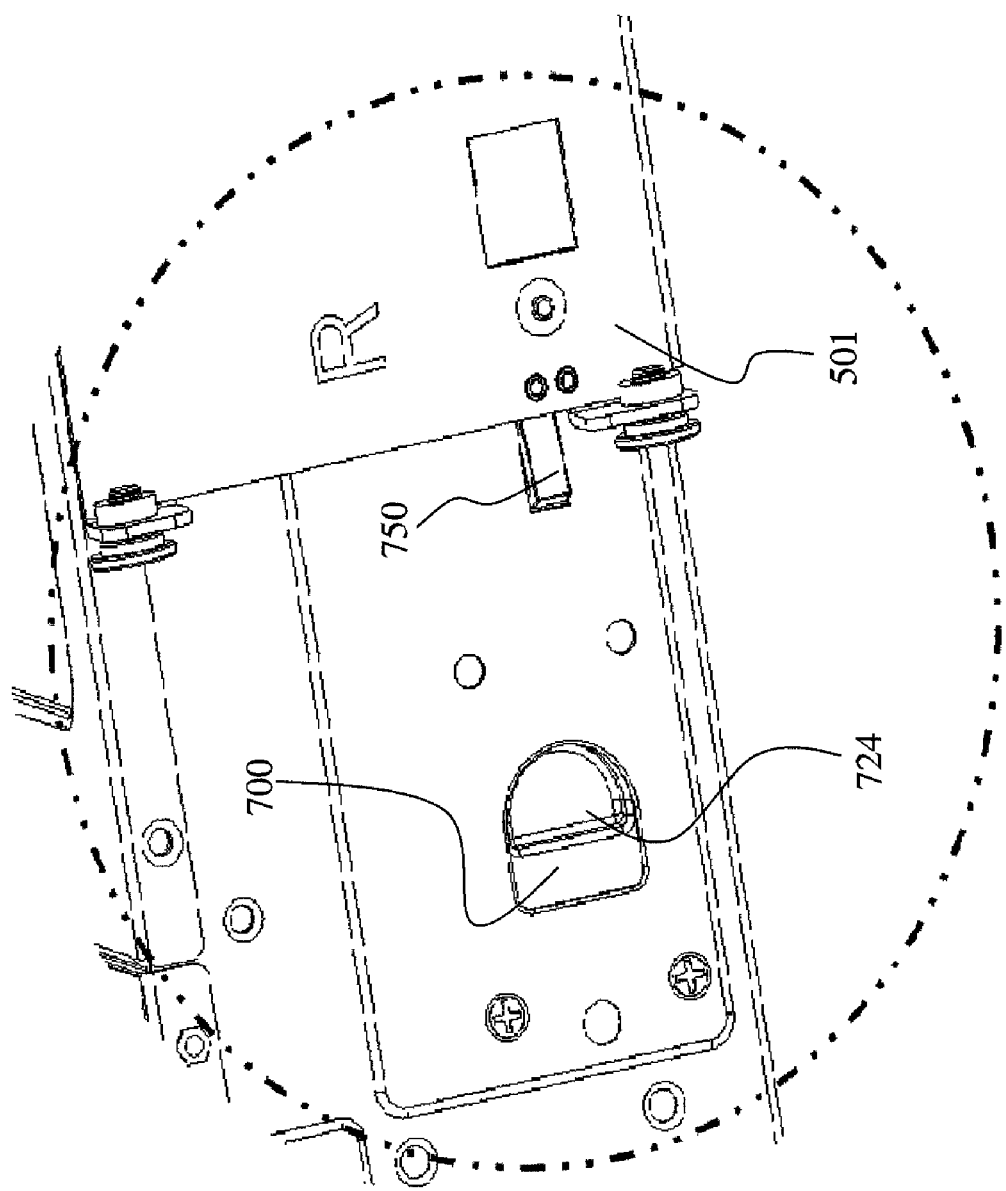

Reference is made FIG. 1D and its the enlarged partial view FIGS. 2I and 2K, which show the component parts that are located at a relative location D. At the relative location D, the user keeps drawing or moving the enclosure 201 along the direction of arrow D in FIG. 1A, and because slider 301 is blocked by the block 405, and thus does not move any more, and the top end 307 of the 7-shaped resilient piece 302 does not get contact with the inner edge 2051 of the hole 205 of the ear portion 202 (that is, the inner edge 2051 of the ear portion 202 is not retained by the top end 307 of the 7-shaped resilient piece 302, referring to FIGS. 2C and 2D), the ear portion 202 of the enclosure 201 can be easily separated from the slider 301.

The present invention has the following characteristics.

Generally speaking, when the center of gravity of the enclosure 201 surpasses the rack 200, the enclosure 201 will turn over and drops to the ground so that the electronic devices in the enclosure 201 will be damaged and the user may get hurt, which are very serious problems, but, by using the locking mechanism of the present invention, when the center of gravity of the enclosure 201 surpasses the rack 200, the enclosure 201 remains in the rack 200 without turning over and dropping to the ground. Here, a wedging device is provided to block the enclosure 201 in order to avoid that the enclosure 201 separates from the support 401 unless the user releases the wedging device to separate the enclosure 201 from the support 401. Therefore, the problems of dropping enclosure 201 to the group can be solved and the abovementioned situation can be avoided.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A sliding rail having an anti-tilting mechanism, comprising:
   a slidable connecting piece that is located on one side of an enclosure, where the slidable connecting piece has a fourth retaining portion;
   a slider that has a second slidable connecting portion on an outer side of the slider, and that has a resilient piece on an inner side of the slider, where the resilient piece has a third retaining portion in order to retain or release the fourth retaining portion of the slidable connecting piece, and has a second retaining portion; and
   a support that has a first slidable connecting portion and has a first retaining portion, where the second slidable connecting portion of the slider is slidably connected with the first slidable connecting portion and makes a relative movement back and forth;
   wherein when the slider and the support are located at a first relative location, the resilient piece of the slider retains the fourth retaining portion of the slidable connecting piece;
   wherein when the slider and the support are at a second relative location, the first retaining portion of the support passes through the third retaining portion of the resilient piece, and the first retaining portion compresses the second retaining portion of the resilient piece to move out to let the slidable connecting piece of the enclosure be released from the slider.

2. The sliding rail having the anti-tilting mechanism as claimed in claim 1, wherein the slider further includes a first limitation portion to retain the slidable connecting piece of the enclosure in the slider.

3. The sliding rail having the anti-tilting mechanism as claimed in claim 1, wherein the third retaining portion of the resilient piece gets contact with the fourth retaining portion of the slidable connecting piece in order to retain the fourth retaining portion hole of the slidable connecting piece, so that the slidable connecting piece of the enclosure is retained in the slider.

4. The sliding rail having the anti-tilting mechanism as claimed in claim 1, wherein the enclosure receives at least one electronic device, and the at least one electronic device includes at least one of a server, a redundant array of independent disks, a fan, and a power supply.

5. The sliding rail having the anti-tilting mechanism as claimed in claim 1, further comprising a block that blocks the slider so that when at the second relative location, the slider does not move any more.

6. The sliding rail having the anti-tilting mechanism as claimed in claim 1, wherein the second slidable connecting portion is a mushroom-shaped guide pin.

7. The sliding rail having the anti-tilting mechanism as claimed in claim 6, wherein the mushroom-shaped guide pin is fastened on the outer side of the slider by a press way.

8. The sliding rail having the anti-tilting mechanism as claimed in claim 1, wherein the first slidable connecting portion is a trench.

9. The sliding rail having the anti-tilting mechanism as claimed in claim 1, wherein the resilient piece is a 7-shaped resilient piece.

10. The sliding rail having the anti-tilting mechanism as claimed in claim 1, wherein the resilient piece is fastened on the inner side of the slider.

11. The sliding rail having the anti-tilting mechanism as claimed in claim 1, wherein the first retaining portion is a V-shaped guide pin.

12. The sliding rail having the anti-tilting mechanism as claimed in claim 1, wherein a compression portion of the first retaining portion compresses the second retaining portion of the resilient piece and makes the second retaining portion move out, so that the third retaining portion of the resilient piece does not get contact with the fourth retaining portion of the slidable connecting piece in order to release the slidable connecting piece of the enclosure from the slider.

13. The sliding rail having the anti-tilting mechanism as claimed in claim 1, wherein when the slider and the support are located at the first relative location, the resilient piece of the slider retains the fourth retaining portion of the slidable connecting piece to slide along the trench.

14. The sliding rail having the anti-tilting mechanism as claimed in claim 1, further comprising a locking mechanism, where the locking mechanism comprises:
  a base,
  a stopping rod that is fastened on the base in a pivoting way and that has an end, where the end extends out or draws back inwards in order to determine whether to get contact with a stopper or not;
  a slidable plate that is located on the base and makes a relative movement to the base, where by moving the slidable plate back and forth, the end of stopping rod is controlled to extend out or draw back inwards; and
  an elastic piece for hooking the slidable plate to make the end of the stopping rod extend out.

15. The sliding rail having the anti-tilting mechanism as claimed in claim 1, further comprising a locking mechanism, where the locking mechanism comprises:
  a base;
  a stopping rod that is fastened on the base in a pivoting way;
  a slidable plate that is located on the base and that makes a movement between a third location and a fourth location relative to the base, where when the slidable plate is at the third location, the stopping rod is at a first angle location so that the enclosure is not drawn from the support, and when the slidable plate is at the fourth location, the stopping rod is at a second angle location so that the enclosure is drawn from the support; and
  an elastic piece for keeping the stopping rod at the first angle location in a normal status.

16. A locking mechanism, comprising:
  a base coupled to an enclosure, the enclosure being displaceably coupled to a support;
  a stopping rod that is fastened on the base in a pivoting manner;
  a slidable plate that overlays a portion of the base and makes a movement between a third location and a fourth location relative to the base, where when the slidable plate is at the third location, the stopping rod is at a first angle location to extend transversely beyond the slidable plate so that the enclosure is not drawn from the support, and when the slidable plate is at the fourth location, the stopping rod is at a second angle location to be withdrawn from the slidable plate so that the enclosure is drawn from the support; and
  an elastic piece for keeping the stopping rod at the first angle location in a normal status.

17. A sliding rail having an anti-tilting mechanism, comprising:
  a slidable connecting piece that is located on one side of an enclosure, where the slidable connecting piece has a fourth retaining portion;
  a slider that has a second slidable connecting portion and a third retaining portion, where the third retaining portion is used to retain or release the fourth retaining portion of the slidable connecting piece; and
  a support that has a first slidable connecting portion and a first retaining portion, where the second slidable connecting portion of the slider is connected with the first slidable connecting portion and makes a relative movement back and forth;
  wherein when the slider and the support are at a first relative location, the third retaining portion of the slider retains the fourth retaining portion of the slidable connecting piece;
  wherein when the slider and the support are at a second relative location, the first retaining portion of the support makes the third retaining portion move so that the slidable connecting piece of the enclosure is released from the slider.

18. The sliding rail having the anti-tilting mechanism as claimed in claim 17, wherein the first retaining portion makes the second retaining portion move in order to further make the third retaining portion move so that the slidable connecting piece of the enclosure is released from the slider.

19. The sliding rail having the anti-tilting mechanism as claimed in claim 17, wherein the slider further includes a first limitation portion to retain the slidable connecting piece of the enclosure in the slider.

20. The sliding rail having the anti-tilting mechanism as claimed in claim 17, further comprising a block that blocks the slider so that when at the second relative location, the slider does not move any more.

* * * * *